(12) United States Patent
Hill et al.

(10) Patent No.: US 12,073,224 B2
(45) Date of Patent: Aug. 27, 2024

(54) AUTOCONFIGURATION OF HARDWARE COMPONENTS OF VARIOUS MODULES OF A SUBSTRATE PROCESSING TOOL

(71) Applicant: LAM RESEARCH CORPORATION, Fremont, CA (US)

(72) Inventors: Bridget Hill, Mountain View, CA (US); Scott Baldwin, Reston, VA (US); Thomas A. Stubblebine, Fremont, CA (US); Rainer Unterguggenberger, Newark, CA (US); Raymond Chau, San Ramon, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 17/788,644

(22) PCT Filed: Nov. 13, 2020

(86) PCT No.: PCT/US2020/060369
§ 371 (c)(1),
(2) Date: Jun. 23, 2022

(87) PCT Pub. No.: WO2021/141665
PCT Pub. Date: Jul. 15, 2021

(65) Prior Publication Data
US 2023/0030233 A1  Feb. 2, 2023

Related U.S. Application Data
(60) Provisional application No. 62/957,588, filed on Jan. 6, 2020.

(51) Int. Cl.
*G06F 9/4401*  (2018.01)
*G06F 9/445*  (2018.01)
*G06F 15/177*  (2006.01)

(52) U.S. Cl.
CPC ........ *G06F 9/4401* (2013.01); *G06F 9/44505* (2013.01); *G06F 15/177* (2013.01)

(58) Field of Classification Search
None
See application file for complete search history.

(56) References Cited

U.S. PATENT DOCUMENTS

| | | | |
|---|---|---|---|
| 7,806,642 B2 | 10/2010 | Narita et al. | |
| 9,329,922 B1 * | 5/2016 | McFarlane | G06F 11/3664 |

(Continued)

FOREIGN PATENT DOCUMENTS

| | | |
|---|---|---|
| JP | 2010206232 A | 9/2010 |
| JP | 2017117930 A | 6/2017 |
| WO | WO-2007061116 A1 | 5/2007 |

OTHER PUBLICATIONS

International Search Report and Written Opinion of the ISA issued in PCT/US2020/060369, mailed Mar. 9, 2021; ISA/KR.

*Primary Examiner* — Paul Yen

(57) ABSTRACT

A substrate processing system comprises a module to perform an operation associated with processing a semiconductor substrate in the substrate processing system. The module includes a component used with the processing of the semiconductor substrate, and a file stored in the module. The file includes information about the component of the module. The substrate processing system comprises a controller to communicate with the module via a network of the substrate processing system. The controller receives the file from the module via the network, reads the information about the component from the received file, and maps, based on the information read from the received file, the component of the module to an option in an application used to configure the module. The controller automatically config- (Continued)

ures the component of the module using the option in the application to which the component of the module is mapped.

17 Claims, 14 Drawing Sheets

(56) References Cited

U.S. PATENT DOCUMENTS

| | | | |
|---|---|---|---|
| 9,952,750 B2* | 4/2018 | Bertram | G06F 9/44 |
| 10,269,605 B2 | 4/2019 | Ikeda | |
| 2009/0259335 A1 | 10/2009 | Ikeda et al. | |
| 2013/0190943 A1* | 7/2013 | Wester | F24F 11/58 |
| | | | 700/297 |
| 2013/0226336 A1 | 8/2013 | Hoffman et al. | |
| 2014/0025677 A1* | 1/2014 | Asai | G06F 16/13 |
| | | | 707/737 |
| 2015/0302199 A1* | 10/2015 | Page | G06F 21/44 |
| | | | 713/1 |
| 2017/0147059 A1* | 5/2017 | Lee | G06F 1/3296 |
| 2018/0040492 A1 | 2/2018 | Wong et al. | |
| 2018/0189165 A1* | 7/2018 | Yamada | G06F 11/00 |

\* cited by examiner

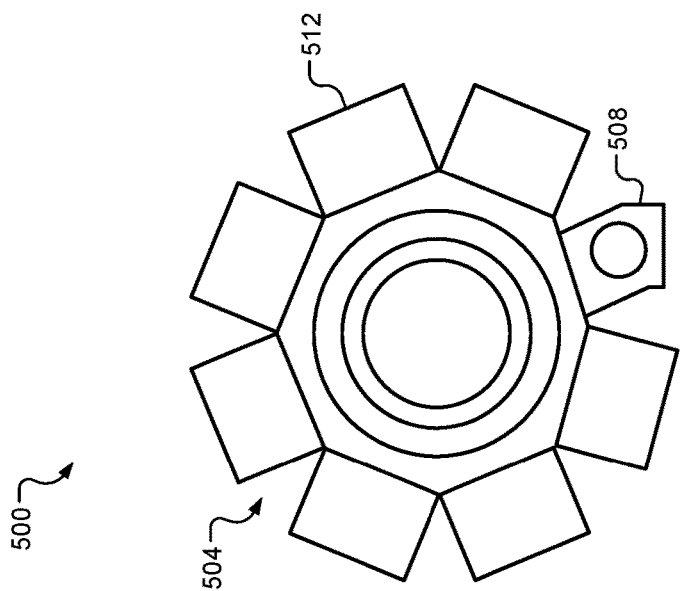
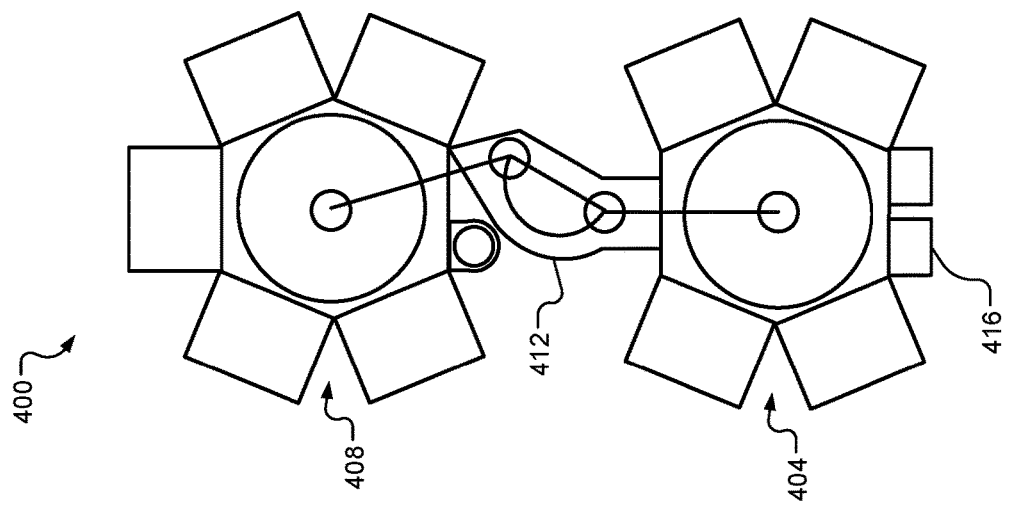
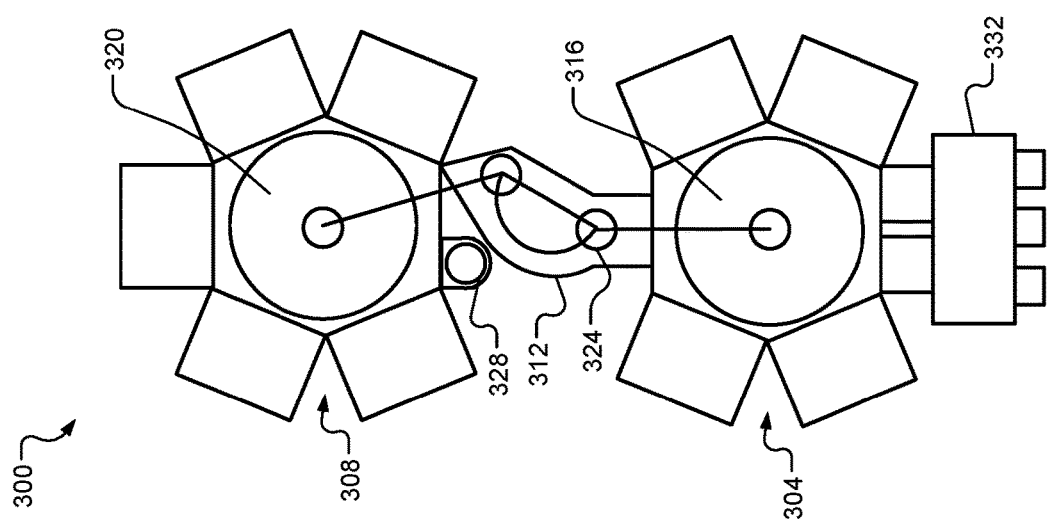

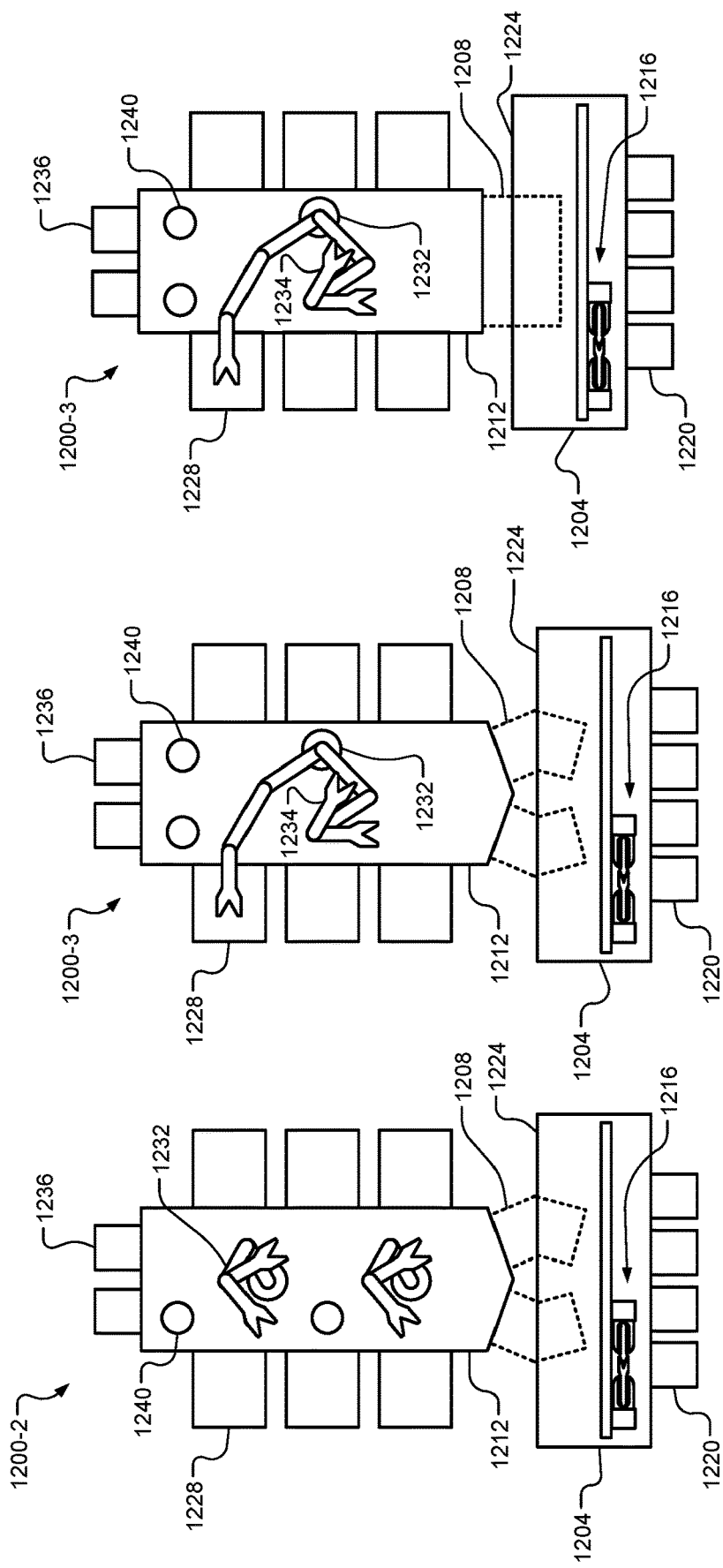

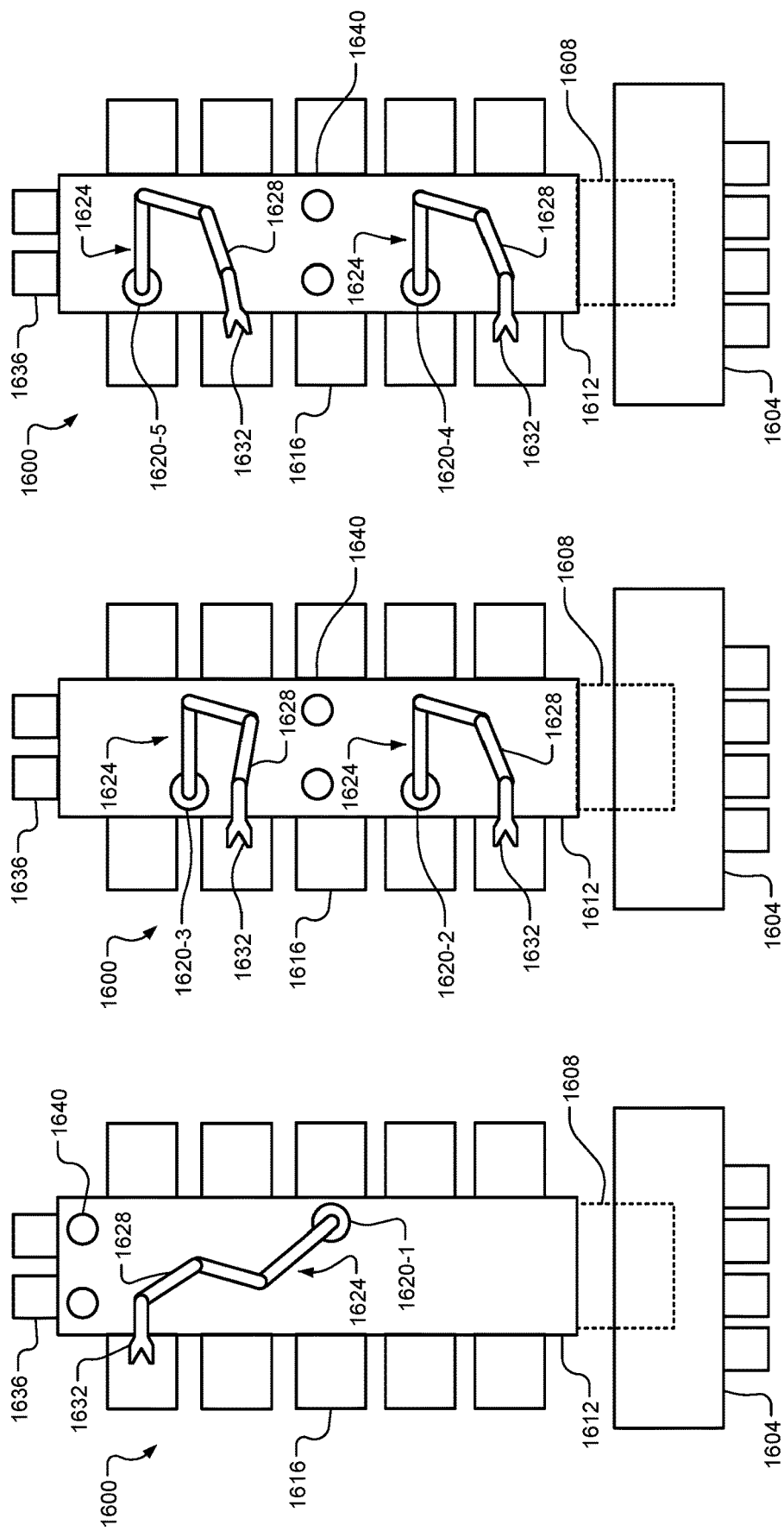

AUTOCONFIGURATION OF HARDWARE COMPONENTS OF VARIOUS MODULES OF A SUBSTRATE PROCESSING TOOL

CROSS-REFERENCE TO RELATED APPLICATIONS

This application is a U.S. National Phase Application under 35 U.S.C. 371 of International Application No. PCT/US2020/060369, filed on Nov. 13, 2020, which claims the benefit of U.S. Provisional Application No. 62/957,588, filed on Jan. 6, 2020. The entire disclosures of the applications referenced above are incorporated herein by reference.

FIELD

The present disclosure relates generally to substrate processing systems and more particularly to auto-configuration of hardware components of various modules of a substrate processing tool.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system typically includes a plurality of processing chambers (also called process modules) to perform deposition, etching, and other treatments of substrates such as semiconductor wafers. Examples of processes that may be performed on a substrate include, but are not limited to, a plasma enhanced chemical vapor deposition (PECVD) process, a chemically enhanced plasma vapor deposition (CEPVD) process, and a sputtering physical vapor deposition (PVD) process. Additional examples of processes that may be performed on a substrate include, but are not limited to, etching (e.g., chemical etching, plasma etching, reactive ion etching, etc.) and cleaning processes.

During processing, a substrate is arranged on a substrate support such as a pedestal, an electrostatic chuck (ESC), and so on in a processing chamber of the substrate processing system. During deposition, gas mixtures including one or more precursors are introduced into the processing chamber, and plasma is struck to activate chemical reactions. During etching, gas mixtures including etch gases are introduced into the processing chamber, and plasma is struck to activate chemical reactions. A computer-controlled robot typically transfers substrates from one processing chamber to another in a sequence in which the substrates are to be processed.

SUMMARY

A substrate processing system comprises a module configured to perform an operation associated with processing a semiconductor substrate in the substrate processing system. The module includes a component used with the processing of the semiconductor substrate, and a file stored in the module. The file includes information about the component of the module. The substrate processing system comprises a controller configured to communicate with the module via a network of the substrate processing system. The controller is configured to receive the file from the module via the network of the substrate processing system, read the information about the component from the received file, and map, based on the information read from the received file, the component of the module to an option in an application used to configure the module. The controller is configured to automatically configure the component of the module using the option in the application to which the component of the module is mapped.

In another feature, the controller is further configured to populate a drop down menu of the application with the option to which the component is mapped.

In another feature, the controller is further configured to allow additional configuration of the component using the option from the drop down menu of the application.

In another feature, the information includes at least one of a part number, a serial number, a manufacturing date, and a location of the component in the module.

In another feature, the module includes a load lock, an airlock, an equipment front end module, a vacuum transfer module, or a process module of the substrate processing system.

In another feature, the controller is further configured to store data about at least one of usage of the component and service performed on the component, analyze the data, and generate an alert indicating a status of the component.

In another feature, the information is stored in the file in a JavaScript Object Notation format.

In still other features, a substrate processing system comprises a processor and a memory storing an application for execution by the processor to receive, from a module of the substrate processing system, a file including information about a component of the module; to map, based on the information, the component to an option in the application used to configure the module; and to automatically configure the component of the module using the option in the application to which the component of the module is mapped.

In another feature, the application is further configured to populate a drop down menu of the application with the option to which the component is mapped.

In another feature, the application is further configured to allow additional configuration of the component using the option from the drop down menu of the application.

In another feature, the information includes at least one of a part number, a serial number, a manufacturing date, and a location of the component in the module.

In another feature, the module includes a load lock, an airlock, an equipment front end module, a vacuum transfer module, or a process module of the substrate processing system.

In another feature, the application is further configured to store data in the memory about at least one of usage of the component and service performed on the component, analyze the data, and generate an alert indicating a status of the component.

In another feature, the application is further configured to communicate with the module via a network of the substrate processing system, and receive the file from the module via the network of the substrate processing system.

In other features, the module is configured to perform an operation associated with processing of a semiconductor substrate in the substrate processing system. The component is used with the processing of the semiconductor substrate.

In another feature, the information is stored in the file in a JavaScript Object Notation format.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 3A-3I show various example configurations of the substrate processing tools;

FIGS. 5A through 5D show plan views of various example configurations of the substrate processing tools;

FIGS. 6A through 6C show plan views of additional example configurations of the substrate processing tools.

In the drawings, reference numbers may be reused to identify similar and/or identical elements.

DETAILED DESCRIPTION

Figure 2:
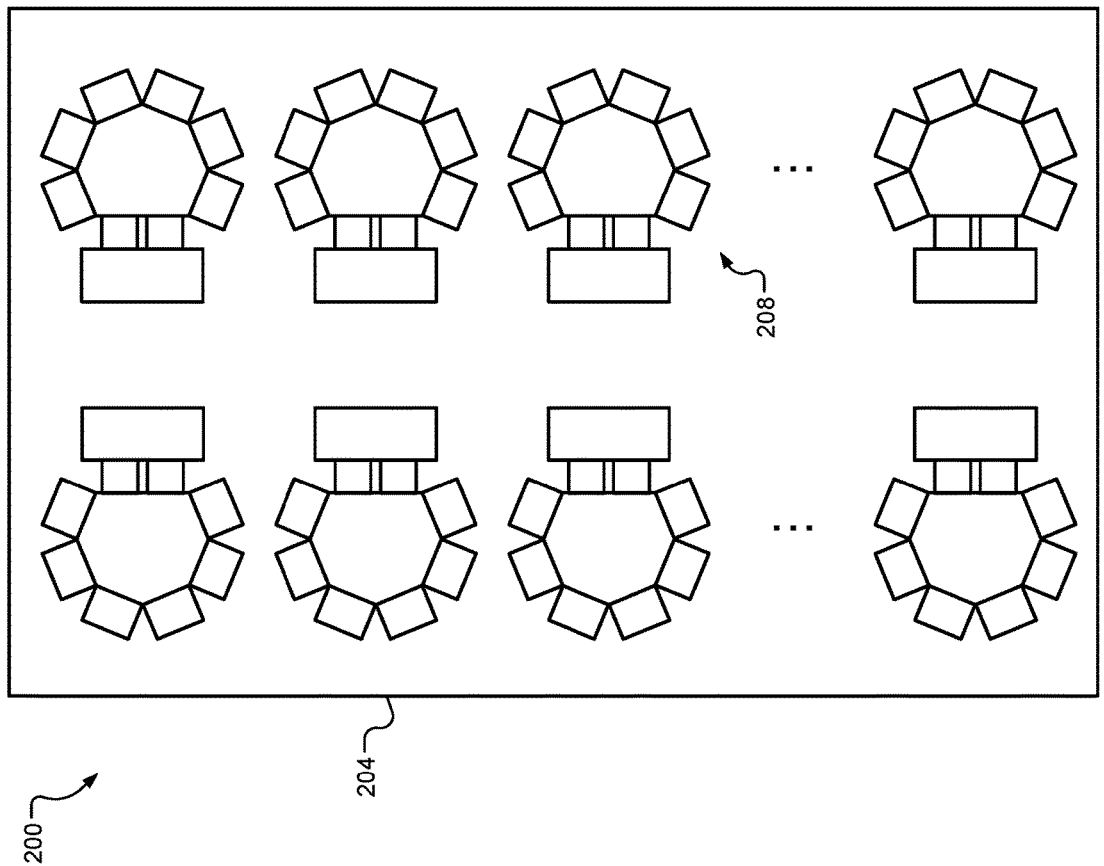
FIG. 2 shows an example arrangement of the substrate processing tools in a fabrication facility.

Currently, a user of a substrate processing tool uses drop down menus of a configuration application executed on a system computer controlling the tool to select options for configuring hardware and software features of various modules of the tool. There can be human error in the manual selection process, which is avoidable, especially where the user selects a wrong hardware option that conflicts with the hardware that is physically present on the tool. Instead, in an auto-configuration system according to the present disclosure explained below in detail, the tool is provided with and therefore has knowledge of what hardware the tool includes, and the tool automatically selects the corresponding configuration options based on the knowledge.

Specifically, a tool supplier that assembles a module (e.g., VTM, EFEM, load lock, etc.) can scan or otherwise record information about parts or hardware components used during assembly of the module and format the information into a file. The information can include, for example, part number, serial number, date of manufacture, location of the part in the module (e.g., Airlock 1 or Airlock 2), etc. The supplier can store the file in any suitable component integrated with the module. For example, the supplier can load the file in a memory on a printed circuit board (PCB), which is a component of the module, and which may perform other functions associated with the module (e.g., controlling the module as described below) besides storing the file. Pilot manufacturing can add information to the file as well. The module with the integrated PCB including the file arrives on site and is installed on the tool.

When the user opens the configuration application on the system computer, the user can press an auto-configuration button. The configuration application reads the file from all the modules' PCBs (or from any other module component where the file may be stored), maps the part numbers to the corresponding choices (i.e., options) in the configuration application, selects the right choices (i.e., options), and automatically and correctly configures the hardware components of the modules. The user can still make other choices in the configuration application that are not dependent on the hardware. After the configuration is complete, the part information can also be displayed on a user interface (UI). Using the tool's main software, data such as lifetime counters and replacement history for the components can be recorded (e.g., stored in a database along with the file or appended to the file received from the modules) for analysis, component improvement, and troubleshooting.

Currently the tools do not include an auto-configuration capability. The user manually selects all the options in the configuration application. Component information is currently available at the tool only for few components that plug directly into the tool computer's network. However, most components (e.g., valves, O-rings, manifolds, etc.) only have the information available on the packaging or on a label on the component itself. Depending on the supplier and the component, the supplier might store component information in its local database and might also upload that information to the tool manufacturer's database. If a person at the tool needs access to information about a valve, for example, the person has to find the serial number on the label on the valve, write it down, leave the fab, and check the tool manufacturer's database or email the serial number to the supplier to obtain the information. One aspect of the auto-configuration system according to the present disclosure is to have suppliers put the component information for all of the components used in the modules onto the module's PCB itself (e.g., the module's controller or in any other module component) so that the information travels with the modules and their components through the manufacturing and assembling processes to the final destination at the tool.

One challenge is how the tool can know what hardware the tool has so that the tool rather than a human can select the configuration options. The auto-configuration system of the present disclosure solves this problem by putting the information onto the module's PCB (or elsewhere in the module) in a specific format that can be read by the configuration application executed by the system computer controlling the tool. An alternative way is to include RFID tags on the parts and include RFID readers mounted on the tool. However, this solution has been shown to be impractical or undesirable. A system of RFID readers and tags has a high cost, and RFIDs have a relatively low read rate in environments with a lot of surrounding metal, which is present in the tool.

Another challenge is mapping the part numbers to the correct configuration option. This can be complicated because often there are software-only options (e.g., the hardware component is the same, but can be used in different ways using different software configurations). Further, there are often many different part numbers for the kits, assemblies, and individual components that the supplier uses during manufacturing. While the user still needs to select software-only options, the auto-configuration system of the present disclosure solves the mapping problem by listing out part numbers for the kits, assemblies, and components, and mapping the part numbers to specific options in the configuration application.

There are other challenges around how to manage the flow of information from the supplier all the way to the tool for auto-configuration (and additional challenges for how to keep the information up to date at the tool). Alternative ways include transporting the component information not with the PCB or within the module. Instead, the information could be gathered from the tool manufacturer's database and other sources, and put on a flash drive or downloaded from the cloud to the tool. These alternative ways, however, would often be prohibited due to customer policies about obtaining the component information from its tool and out of the fab.

Accordingly, the auto-configuration system of the present disclosure includes loading a module's component information onto the module's PCB in a file in a predetermined format, which is then read by the configuration application on the tool's system computer. Based on the information read from the file, the components of the module are mapped to the correct options in the configuration application, which are then automatically and correctly selected and configured without human intervention. Specifically, when the tools is powered up, the tool's system computer reads the files from the tool's different modules, selects the correct mapping (i.e., maps the hardware components from the files to the correct configuration options in the configuration application), and auto-populates the drop down menus of the configuration application.

Thus, the auto-configuration system of the present disclosure eliminates the human factor in selecting the configuration options. Instead, the tool knows its own hardware configuration from the files acquired from the tool's modules and selects the corresponding configuration options. The auto-configuration system can help not only in simple use cases (e.g., detecting whether a component is installed or not in a module) but also in more complex use cases (e.g., by distinguishing between similar looking but actually different components, by easily identifying components buried in an assembly, in situations where the same component can be used differently, etc.). The auto-configuration system can also enhance automation of processes in process modules based on known capabilities of the components in the process modules and the tool.

An additional benefit of the auto-configuration system is having the component information available on the tool in the field, which can be useful for further analyses and troubleshooting. For example, if the same component is used in the same manner in two assemblies, the performance of the component in the two assemblies can be compared, and the comparative data can be used for proactive troubleshooting (e.g., scheduling service and/or ordering replacement before failure occurs), suggesting engineering changes to suppliers, and so on. These and other features of the present disclosure are explained below in detail.

Organization

The present disclosure is organized as follows. Initially, numerous examples of substrate processing tools, their configurations, and processing chambers used therein are shown and described with reference to FIGS. 1-7C. Thereafter, FIGS. 8 and 9 respectively show examples of a system and a method for auto-configuring the hardware of tool modules according to the present disclosure.

FIGS. 1-7C and corresponding descriptions are provided to illustrate various configurations of tools, including various modules and assemblies that can be used in different tools for performing various processes on semiconductor wafers. These figures and their descriptions provide insights about the diversity of hardware components that can be used in various tools and modules and about their different operations, which help in comprehending the need for and the scope of the auto-configuration system of the present disclosure. The auto-configuration system shown and described with reference to FIGS. 8 and 9 can be used with any of the tools and any of the modules and assemblies shown and described with reference to FIGS. 1-7C.

Examples of Tools

Figure 1:
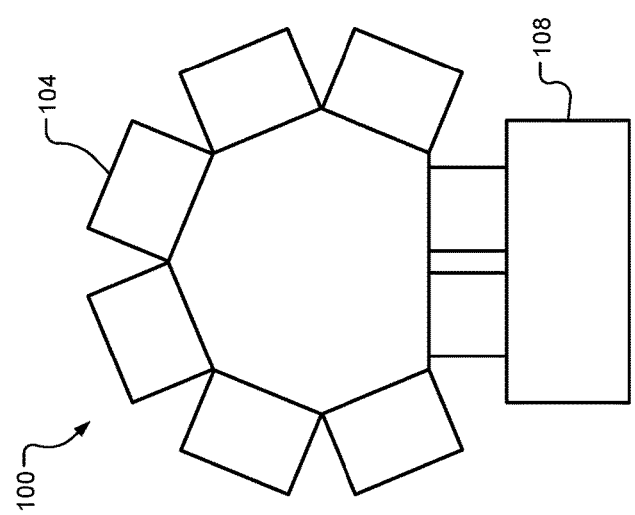
FIG. 1 shows an example of a substrate processing tool.

FIG. 1 shows a top-down view of an example of a substrate processing tool 100. The substrate processing tool 100 includes a plurality of process modules 104. For example only, each of the process modules 104 may be configured to perform one or more respective processes on a substrate. Substrates to be processed are loaded into the substrate processing tool 100 via ports of a loading station of an equipment front end module (EFEM) 108 and then transferred into one or more of the process modules 104. For example, a substrate may be loaded into each of the process modules 104 in succession. As explained in detail with reference to FIGS. 8 and 9, the auto-configuration system can be used to automatically configure the EFEM 108.

FIG. 2 shows an example arrangement 200 of a fabrication room 204 including a plurality of substrate processing tools 208 such as the substrate processing tool 100. FIGS. 3A-3I show various examples of configurations in which the plurality of substrate processing tools 208 such as the substrate processing tool 100 can be arranged. In these examples, the wafers travel through varying paths. Accordingly, the configuration and operation of the robots used to transport the wafers through these paths vary. Further, a variety of sensors are used in these examples to sense various aspects of robots and the wafers. As explained in detail with reference to FIGS. 8 and 9, the auto-configuration system can be used to automatically configure modules and mechanisms that control the robots in these examples.

FIG. 3A shows a first example configuration 300 including a first substrate processing tool 304 and a second substrate processing tool 308 according to the principles of the present disclosure. The first substrate processing tool 304 and the second substrate processing tool 308 are arranged sequentially and are connected by a transfer stage 312, which is under vacuum. As shown, the transfer stage 312 includes a pivoting transfer mechanism configured to transfer substrates between a vacuum transfer module (VTM) 316 of the first substrate processing tool 304 and a VTM 320 of the second substrate processing tool 308. In other examples, the transfer stage 312 may include other suitable transfer mechanisms, such as a linear transfer mechanism.

For example only, a first robot of the VTM 316 may place a substrate on a support 324 arranged in a first position, the support 324 is pivoted to a second position, and a second robot of the VTM 320 retrieves the substrate from the support 324 in the second position. In some examples, the second substrate processing tool 308 may include a storage buffer 328 configured to store one or more substrates between processing stages. The transfer mechanism may also be stacked to provide two or more transfer systems between the substrate processing tools 308 and 304. Transfer stage 324 may also have multiple slots to transport or buffer multiple substrates at one time. In the configuration 300, the first substrate processing tool 304 and the second substrate processing tool 308 are configured to share a single equipment front end module (EFEM) 332.

FIG. 3B shows a second example configuration 400 including a first substrate processing tool 404 and a second substrate processing tool 408 arranged sequentially and connected by a transfer stage 412. The configuration 400 is similar to the configuration 300 of FIG. 3A except that in the configuration 400, the EFEM is eliminated. Accordingly, substrates may be loaded into the first substrate processing tool 408 directly via airlock loading stations 416 (e.g., using a storage or transport carrier such as a vacuum wafer carrier, front opening unified pod (FOUP), etc., or other suitable mechanisms).

FIG. 3C shows a third example configuration 500 including a substrate processing tool 504. The configuration 500 eliminates the EFEM and uses only a single loading station 508, allowing for a greater number (e.g., 7) of process modules 512. At the loading station 508, substrates may be loaded into the second substrate processing tool 408 directly via airlock loading station 416 (e.g., using a storage or transport pod such as a Vacuum Wafer Carrier, front opening unified pod (FOUP), etc., or other suitable mechanisms).

Figure 3E:
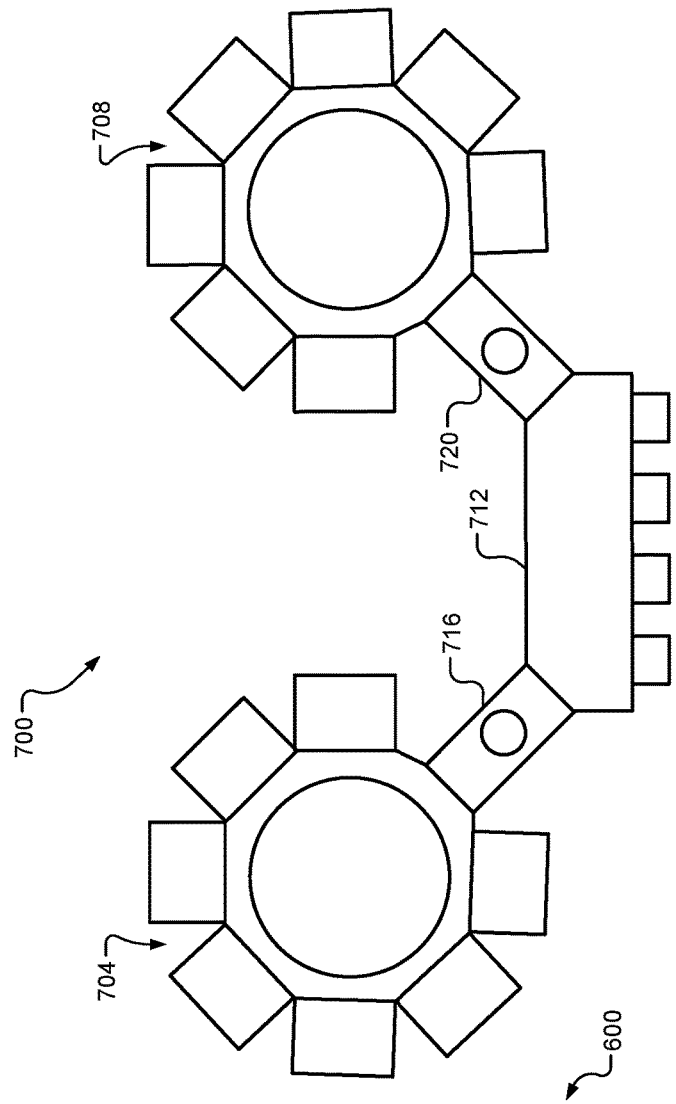
Figure 3D:
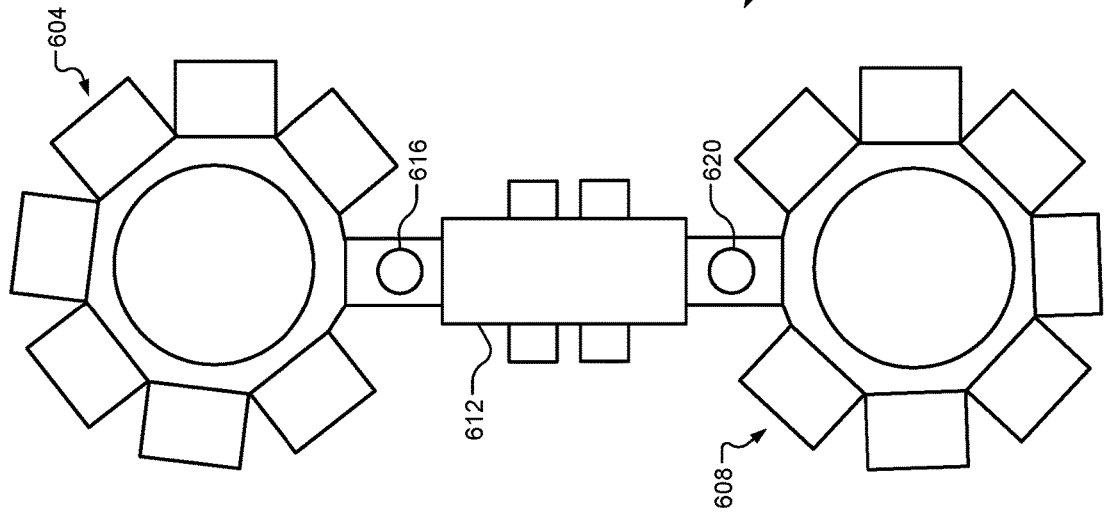

FIG. 3D shows a fourth example configuration 600 including a first substrate processing tool 604 and a second substrate processing tool 608 sharing a single EFEM 612. More specifically, the first substrate processing tool 604 and the second substrate processing tool 608 are connected to respective ends of the EFEM 612 via respective loading stations 616 and 620. The loading stations 616 and 620 may each have a stacked configuration.

FIG. 3E shows a fifth example configuration 700 including a first substrate processing tool 704 and a second substrate processing tool 708 sharing a single EFEM 712. The first substrate processing tool 704 and the second substrate processing tool 708 are connected to respective ends of the EFEM 712 via respective loading stations 716 and 720. The loading stations 716 and 720 may each have a stacked configuration.

Figure 3F:
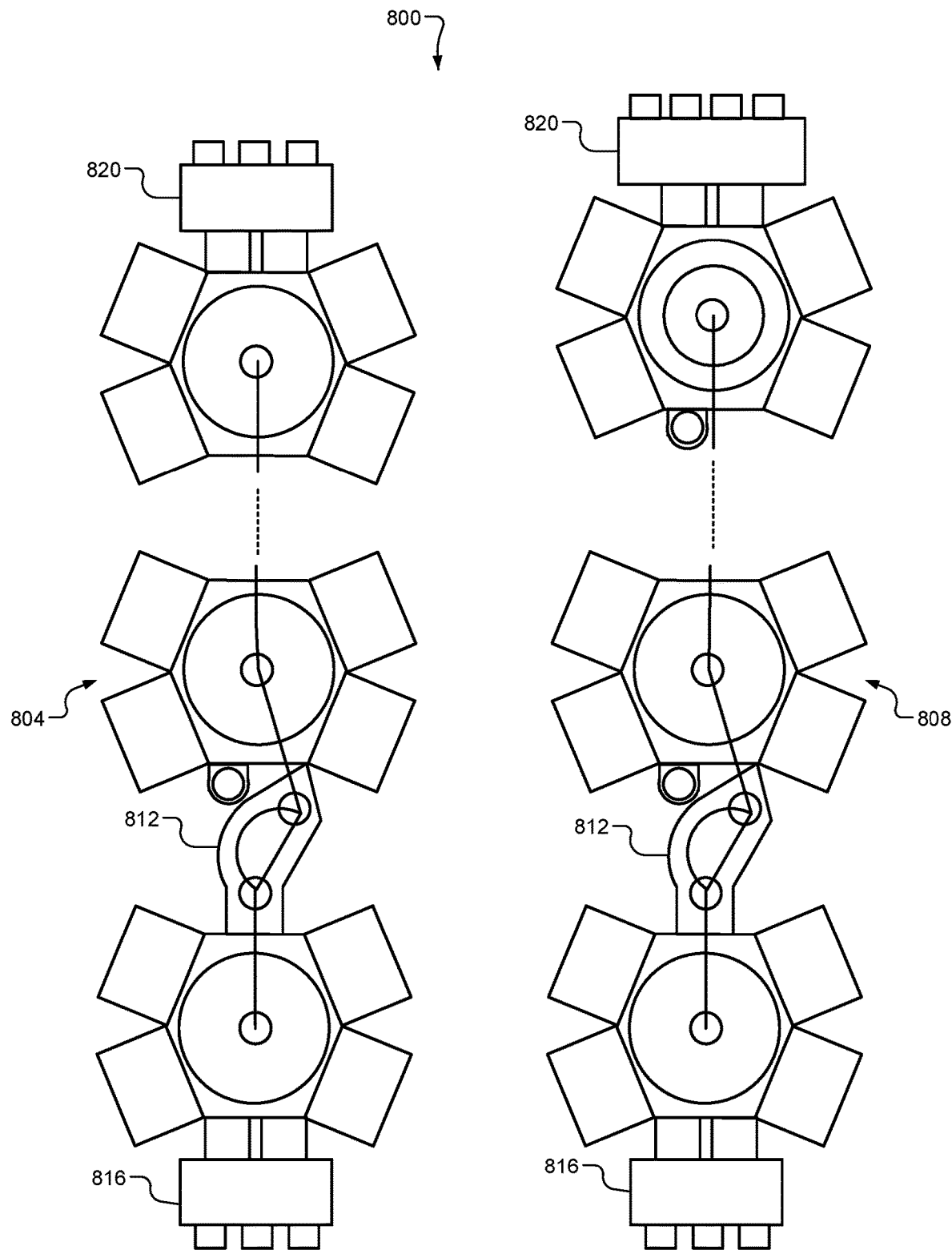

FIG. 3F shows a sixth example configuration 800 including one or more rows of sequentially arranged substrate processing tools 804, 808, etc. In the configuration 800, each row may include 3 or more substrate processing tools connected via respective transfer stages 812. The transfer stages 812 may include pivoting transfer mechanisms, linear transfer mechanisms, etc. A first EFEM 816 is provided at a first end of the row of substrate processing tools 804, 808 and a second EFEM 820 is provided at a second end of the row of substrate processing tools 804, 808. For example, substrates may be loaded at the first EFEM 816, processed and transferred sequentially through the various process modules of the substrate processing tools 804, 808, and then unloaded/retrieved from the second EFEM 820. In some examples, transfer mechanisms within the transfer stages 812 may be vertically stacked to provide two or more transfer systems between adjacent substrate processing tools. The transfer stages 812 may also have multiple slots to move or buffer multiple substrates at a time.

Figure 3H:
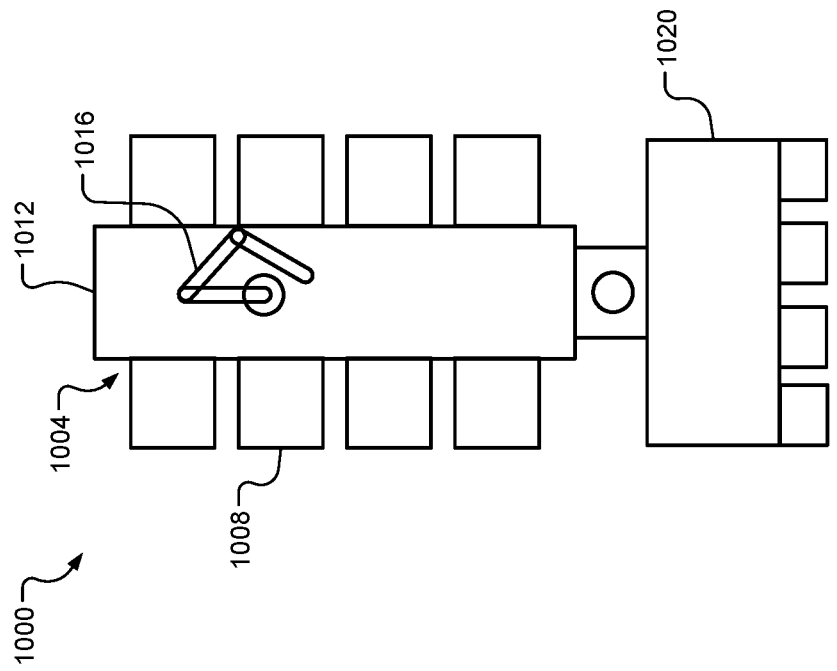
Figure 3G:
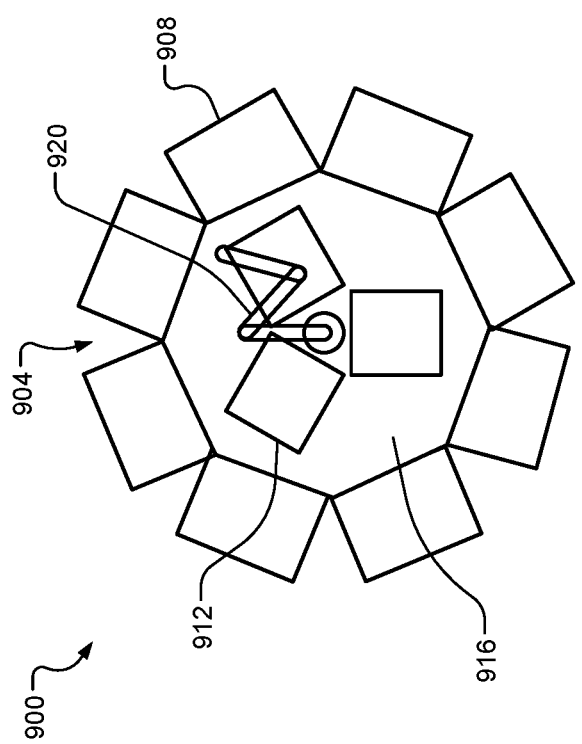

FIG. 3G shows a seventh example configuration 900 including a substrate processing tool 904. In the configuration 900, the substrate processing tool 904 includes, for example, 8 process modules 908 and eliminates both the EFEM and any exterior loading stations. Instead, one or more transport carriers (e.g., vacuum wafer carriers) 912 are provided in an interior 916 of the substrate processing tool 904. For example, the carriers 912 may be transported from above the substrate processing tool 904 using an automated transport system, such as an automated material handling system (AMHS). A robot 920 retrieves substrates from the carriers 912 and transfers the substrates to the process modules 908.

FIG. 3H shows an eighth example configuration 1000 including a substrate processing tool 1004 having a plurality of process modules 1008. The substrate processing tool 1004 includes a linear VTM 1012 and robot 1016 configured to transfer substrates between EFEM 1020 and the process modules 1008. The VTM 1012 is configured to adjust a linear position of the robot 1016 relative to the process modules 1008 (i.e., adjust an end-to-end position of the robot 1016 relative to the VTM 1012).

Figure 3I:
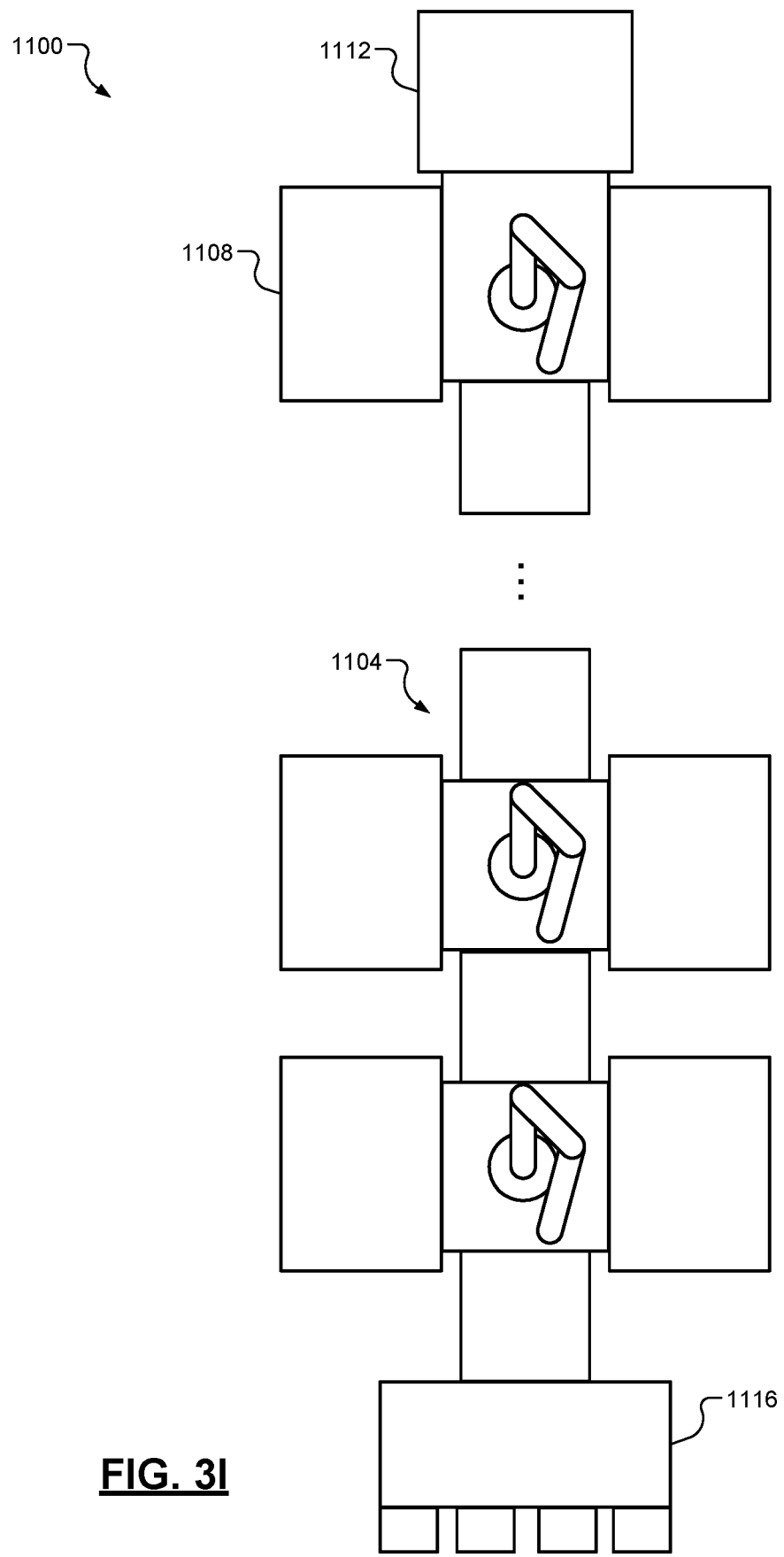
Figure 5A:
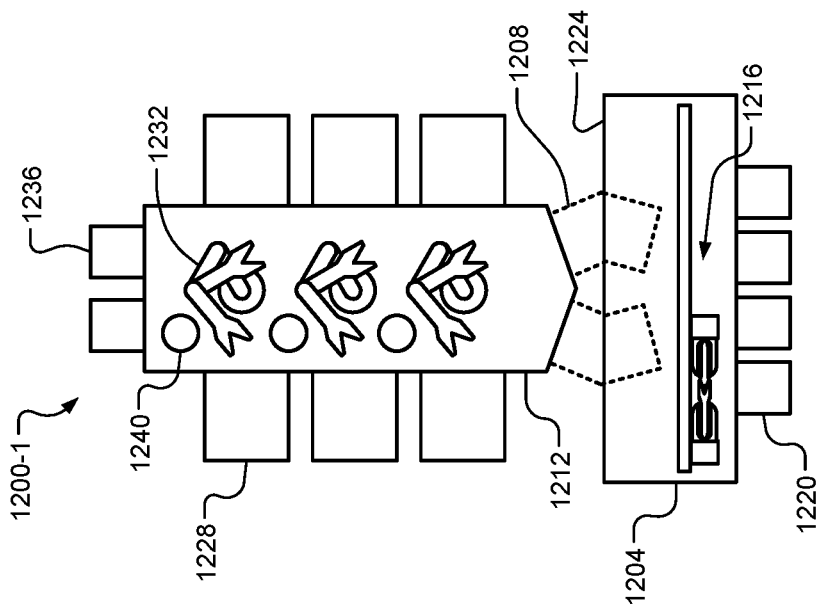

FIG. 3I shows a ninth example configuration 1100 including a substrate processing tool 1104. The substrate processing tool 1104 includes a cluster arrangement of process modules 1108, and an optional end process module 1112. The process modules 1108 share a single EFEM 1116.

In some examples, any of the processing tools described herein may implement loading stations having a stacked configuration. For example, loadings stations 508, 716, 720, etc. as shown in FIGS. 3C and 3E may implement a stacked configuration. In other words, in a stacked configuration, a loading station may include two or more vertically stacked loading stations. In some examples, the stacked configuration may also include a process module or chamber (such as an integrated critical strip (ICS) chamber) vertically stacked with one or more loading stations.

In the above examples, as explained in detail with reference to FIGS. 8 and 9, the auto-configuration system can be used to configure any of the modules including the EFEM, VTM, airlocks, and so on.

Additional Examples of Tools

Figure 4:
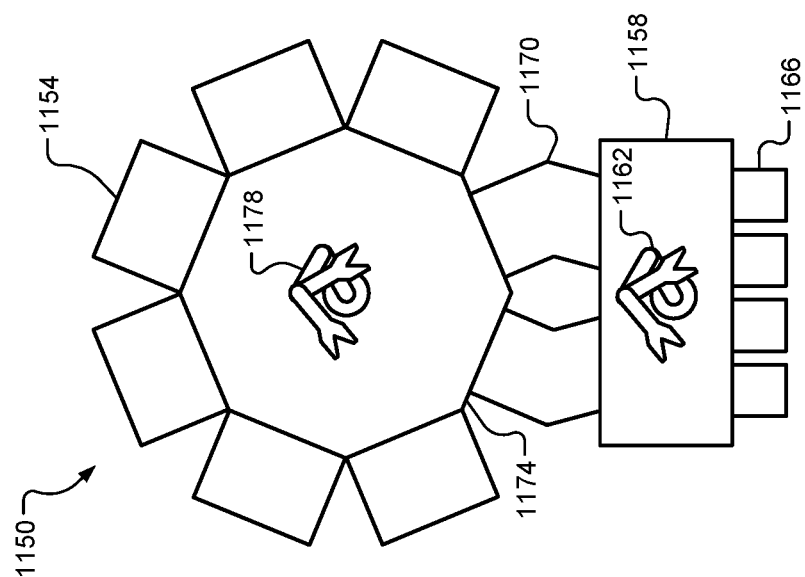
FIG. 4 shows another example of a substrate processing tool.

FIG. 4 shows a top-down view of yet another example of a substrate processing tool 1150. The substrate processing tool 1150 includes a plurality of process modules 1154. For example, each of the process modules 1154 may be configured to perform one or more respective processes on a substrate. Substrates to be processed are loaded into the substrate processing tool 1150 via ports of a loading station of an atmosphere-to-vacuum (ATV) transfer module, such as an equipment front end module (EFEM) 1158, and then transferred into one or more of the process modules 1154. For example, a transfer robot 1162 is arranged to transfer substrates from loading stations 1166 to airlocks, or load locks, 1170, and a vacuum transfer robot 1178 of a vacuum transfer module 1174 is arranged to transfer substrate from the load locks 1170 to the various process modules 1154.

For example, an equipment front end module (EFEM) of a substrate processing tool may include one or more transfer robots for transferring substrates between the EFEM and load locks arranged between the EFEM and a vacuum transfer module (VTM). An internal volume of the EFEM must be sufficient to accommodate the transfer robot. Accordingly, the load locks are typically located outside of a footprint of an equipment front end module (EFEM) between the EFEM and the VTM. In some examples, the EFEM may include a transfer robot having a configuration that allows the airlocks to be located at least partially within the EFEM. The fabrication room 204 shown in FIG. 2 may include a plurality of substrate processing tools 1150.

FIGS. 5A-6C show various examples of configurations in which the plurality of substrate processing tools such as the substrate processing tool 1150 can be arranged. In these examples, the wafers travel through varying paths. Accordingly, the configuration and operation of the transfer robots used to transport the wafers through these paths vary. Further, a variety of sensors are used in these examples to sense various aspects of the transfer robots and the wafers.

FIGS. 5A-5D show plan views of example configurations of a first substrate processing tool 1200-1, a second substrate processing tool 1200-2, and a third substrate processing tool 1200-3 (collectively substrate processing tools 1200). Each of the substrate processing tools 1200, similar to the substrate processing tool 1150, includes a modified equipment front end module (EFEM) 1204 configured to accommodate at least a portion of load locks 1208. In other words, instead of being located outside of the EFEM 1204 in a gap between the EFEM 1204 and a vacuum transfer module (VTM) 1212, the load locks 208 extend into an interior of the EFEM 1204.

Accordingly, the EFEM 1204 can be located closer to the VTM 1212, reducing the overall footprint and increasing the pitch of the substrate processing tools 1200. For example, a transfer robot 1216 of the EFEM 1204 is arranged closer to loading stations 1220 on a front wall (e.g., a first side) than a back wall 1224 (e.g., a second side) of the EFEM 1204 to provide space for the load locks 1208 to extend into the interior of the EFEM 1204. In some examples, the load locks 1208 may be configured as shown in an alternative arrangement of the substrate processing tool 1200-3 in FIG. 5D. For example only, the loading stations 1220 may correspond to front opening unified pods (FOUPs).

As shown, the substrate processing tools 1200 include six process modules 1228. However, other configurations of the substrate processing tools 1200 may include more than six of the process modules 228. For example, a length of the VTM 1212 may be extended to accommodate additional process modules 1228. Similarly, the VTM 1212 may include vacuum transfer robots 1232 having various configurations. For example, the substrate processing tool 1200-1 includes three vacuum transfer robots 1232 and the substrate processing tool 1200-2 includes two vacuum transfer robots 1232. In the substrate processing tools 1200-1 and 1200-3, the robots 1232 are aligned with a center lengthwise axis of the VTM 1212.

Conversely, the substrate processing tool 1200-3 includes a single vacuum transfer robot 1232 arranged off-center (i.e., shifted to the right or left toward the process modules 1228) relative to the center lengthwise axis of the 1VTM 212. In other words, a primary pivot point of the robot 1232 is off-center. Although shown as having one or two arms, each of the robots 1216 and 1232 may have configurations including one, two, or more arms. In some examples, the robot 1232 may include two end effectors 1234 on each of the arms as shown in FIGS. 5C and 5D.

The substrate processing tools 1200 may include one or more storage buffers 236 configured to store one or more substrates between processing stages. In some examples, storage buffers 1240 may be located within the VTM 1212. In some examples, one or more of the storage buffers 1236 may be replaced with process modules or other components.

In some examples, one or more of the EFEM 1204, the load locks 1208, the VTM 1212, and the process modules 1228 may have a stacked configuration. For example, each of the process modules 1228 may correspond to two process modules 1228 in a vertically stacked configuration (i.e., one process module 1228 arranged above/below the other), the VTM 1212 may correspond to two VTMs 1212 in the vertically stacked configuration, each of the load locks 1208 may correspond to two load locks 1208 in the vertically stacked configuration, and each of the loading stations 1220 may correspond to two loading stations 1220 in the vertically stacked configuration. A height of the EFEM 1204 may be increased to allow the robot 1216 to be raised and lowered to different levels within the EFEM 1204 to access multiple levels of the loading stations 1220 and the load locks 1208.

In the above examples, as explained in detail with reference to FIGS. 8 and 9, the auto-configuration system can be used to configure any of the modules including the load locks, EFEM, VTM, airlocks, and so on.

FIGS. 6A-6C show plan views of example configurations of another substrate processing tool 1600. The substrate processing tool 1600 includes a modified equipment front end module (EFEM) 1604 configured to accommodate at least a portion of one or more load locks 1608. In other words, instead of being located entirely outside of the EFEM 1604 in a gap between the EFEM 1604 and a vacuum transfer module (VTM) 1612, the load locks 1608 extend into an interior of the EFEM 1604. Accordingly, the EFEM 1604 can be located closer to the VTM 1612, reducing the overall footprint and increasing the pitch of a plurality of the substrate processing tools 1600.

As shown, the substrate processing tool 1600 includes ten process modules 1616. However, other configurations of the substrate processing tools 1600 may include more than ten of the process modules 1616. For example, a length of the VTM 1612 may be extended to accommodate additional process modules 1616. Similarly, the VTM 1612 may include vacuum one or more transfer robots 1620 (e.g., transfer robots 1620-1, 1620-2, 1620-3, 1620-4, and 1620-5) having various configurations. As shown, the transfer robots 1620 include one arm 1624 having three arm segments 1628 and one end effector 1632 in each of the configurations. In other configurations, the transfer robots 1620 may include one, two, or more arms 1624. In some examples, the robots 1620 may include two of the end effectors 1632 on each of the arms 1624.

In FIG. 6A, the substrate processing tool 1600 includes a single vacuum transfer robot 1620-1 arranged off-center (i.e., shifted to the right or left toward the process modules 1616) relative to the center lengthwise axis of the VTM 1612. In other words, a primary pivot point of the robot 1620-1 is off-center. The robot 1620-1 is positioned and configured to access each of the ten process modules 1616 and the load lock(s) 1608. In configurations where the substrate processing tool 1600 includes storage buffers 1636 and/or storage buffers 1640, the robot 1620-1 is also configured to access the storage buffers 1636/1640.

In FIGS. 6B and 6C, the substrate processing tool 1600 includes two vacuum transfer robot 1620-2 and 1620-3 or 1620-4 and 1620-5, respectively, arranged off-center (i.e., shifted to the right or left toward the process modules 1616) relative to the center lengthwise axis of the VTM 1612. The robots 1620-2 and 1620-4 are positioned and configured to access selected ones of the ten process modules 1616 and the load lock(s) 608. Conversely, the robots 1620-3 and 1620-5 are positioned and configured to access others of the ten process modules 1616. In configurations where the substrate processing tool 1600 includes storage buffers 1636 and/or storage buffers 1640, the robots 1620-3 and 1620-5 may also be configured to access the storage buffers 1636, while both of the robots 1620-2 and 1620-3 in FIG. 6B and both of the robots 1620-4 and 1620-5 in FIG. 6A are configured to access the storage buffers 1640.

For example, as shown in FIG. 6B, the robot 1620-2 is aligned with (e.g., centered on a horizontal axis of) a respective one of the process modules 1616 while the robot 1620-3 is arranged centered between adjacent ones of the process modules 1616. Conversely, as shown in FIG. 6C, each of the robots 1620-4 and 1620-5 is aligned with a respective one of the process modules 1616.

In the above examples, as explained in detail with reference to FIGS. 8 and 9, the auto-configuration system can be used to configure any of the modules including the load locks, EFEM, VTM, airlocks, and so on.

Examples of Chambers

Figure 7A:
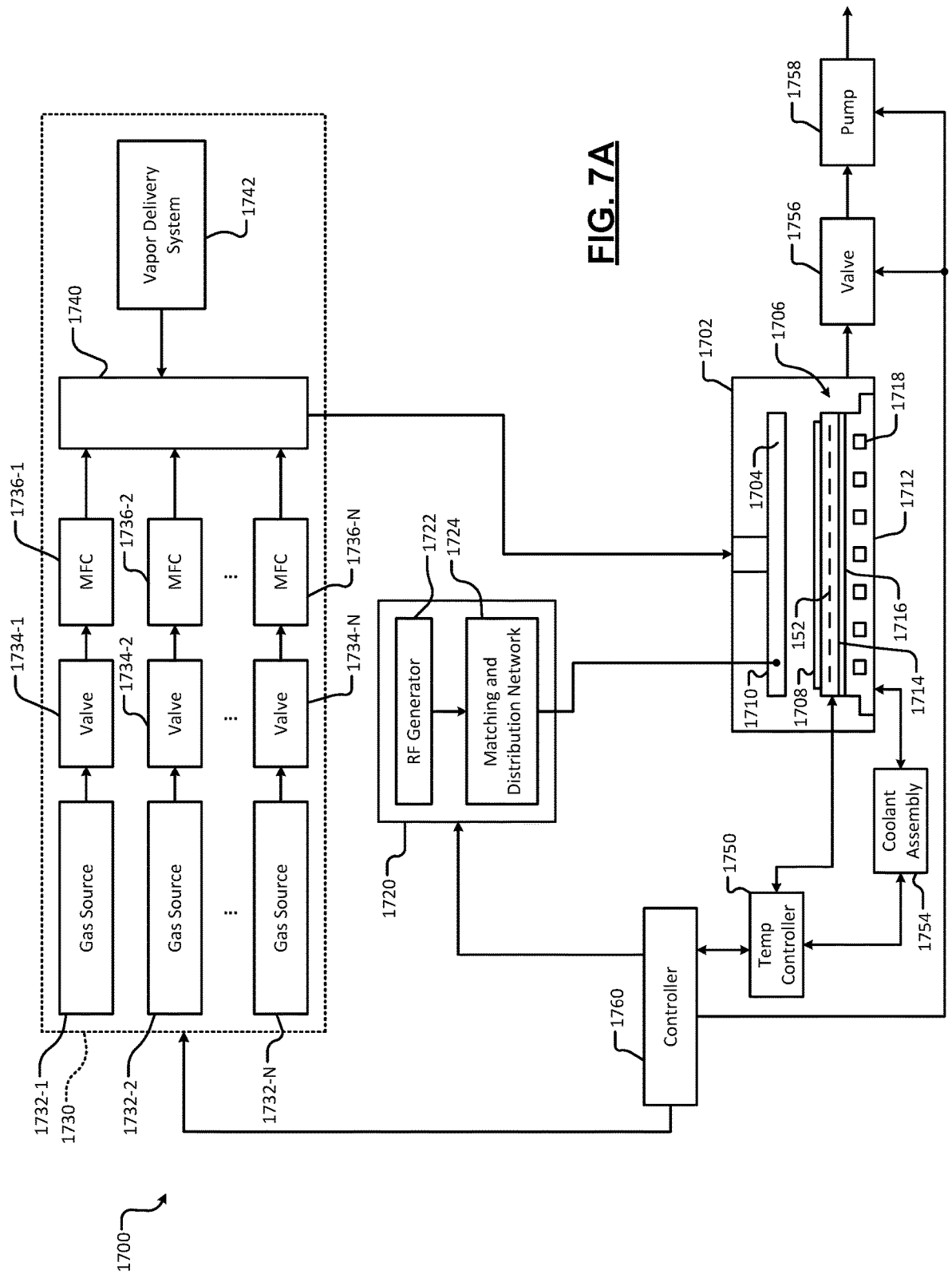
FIGS. 7A-7C show functional block diagrams of substrate processing systems comprising various processing chambers.
Figure 7B:
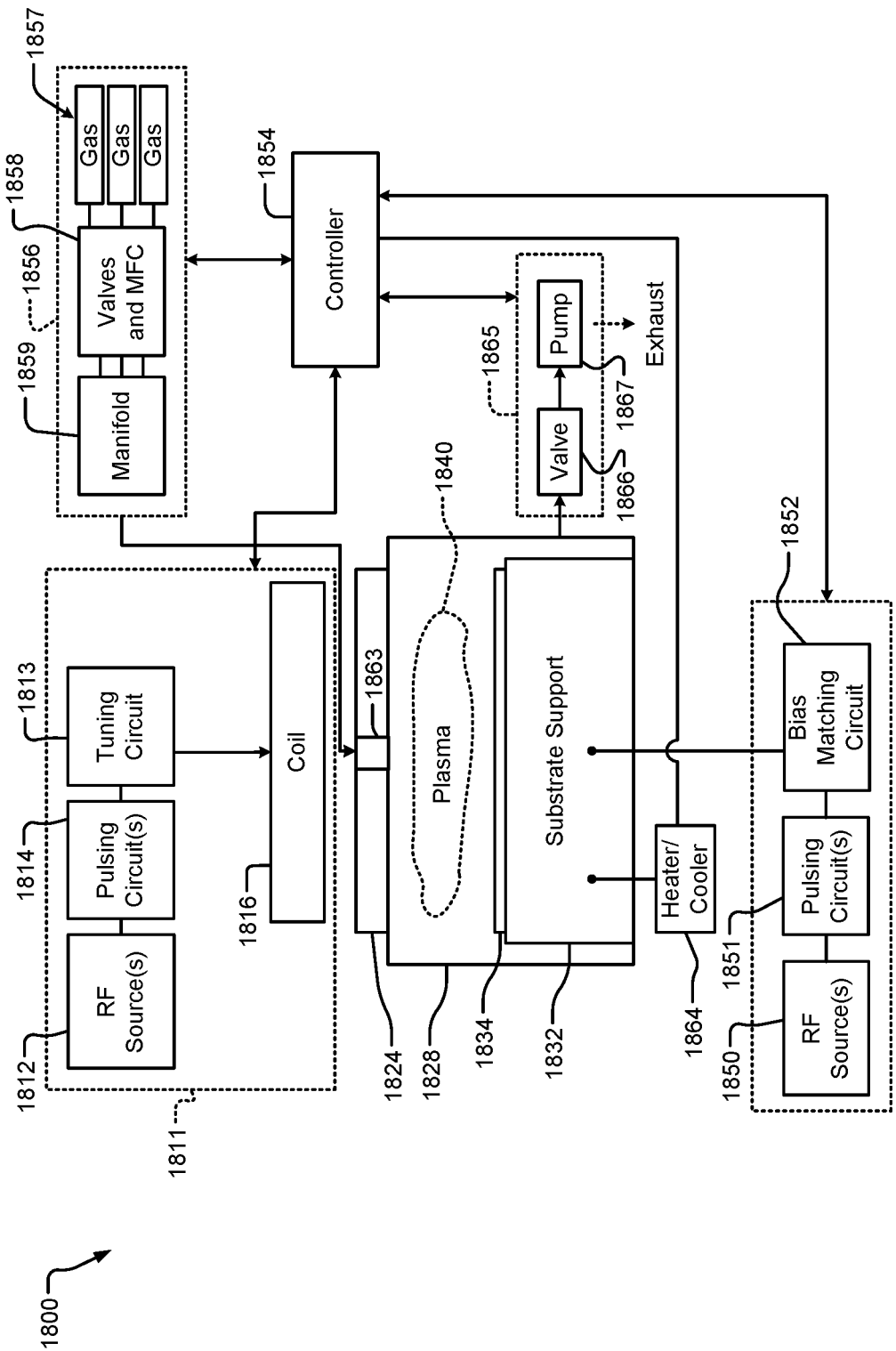
Figure 7C:
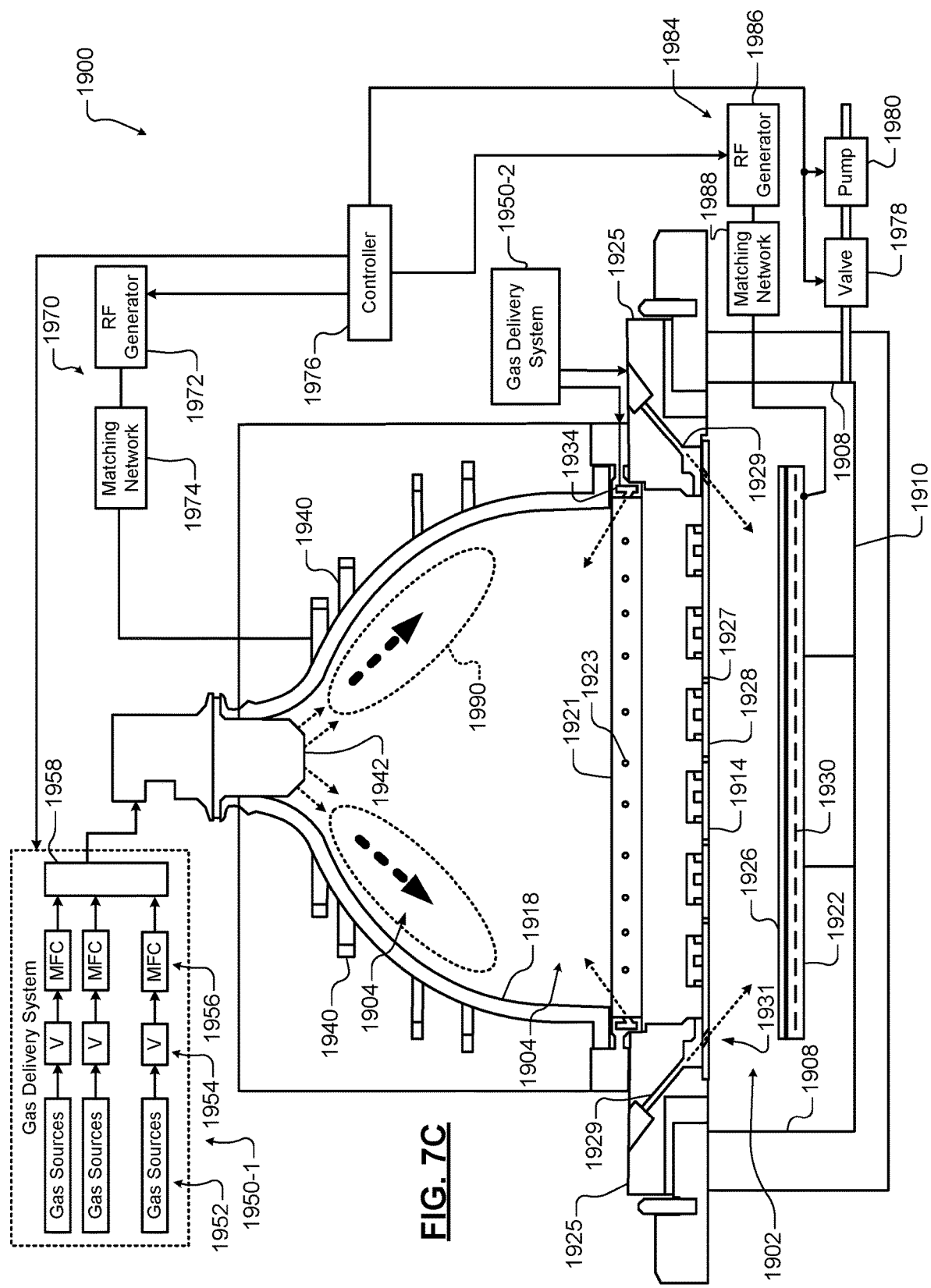

FIGS. 7A-7C show different examples of process modules (PMs) that can be used in the tools shown in FIGS.

1-6C. The auto-configuration system can also be used to auto-configure the hardware components of these process modules. Following the description of FIGS. 7A-7C, the auto-configuration system is described with reference to FIGS. 8 and 9.

FIG. 7A shows an example of a substrate processing system 1700 comprising a processing chamber 1702. While the example is described in the context of plasma enhanced chemical vapor deposition (PECVD), the teachings of the present disclosure can be applied to other types of substrate processing such as atomic layer deposition (ALD), plasma enhanced ALD (PEALD), CVD, or also other processing including etching processes. The system 1700 comprises the processing chamber 1702 that encloses other components of the system 1700 and contains an RF plasma (if used). The processing chamber 1702 comprises an upper electrode 1704 and an electrostatic chuck (ESC) 1706 or other substrate support. During operation, a substrate 1708 is arranged on the ESC 1706.

For example, the upper electrode 1704 may include a gas distribution device 1710 such as a showerhead that introduces and distributes process gases. The gas distribution device 1710 may include a stem portion including one end connected to a top surface of the processing chamber 1702. A base portion of the showerhead is generally cylindrical and extends radially outwardly from an opposite end of the stem portion at a location that is spaced from the top surface of the processing chamber 1702. A substrate-facing surface or faceplate of the base portion of the showerhead includes a plurality of holes through which vaporized precursor, process gas, or purge gas flows. Alternately, the upper electrode 1704 may include a conducting plate, and the process gases may be introduced in another manner.

The ESC 1706 comprises a baseplate 1712 that acts as a lower electrode. The baseplate 1712 supports a heating plate 1714, which may correspond to a ceramic multi-zone heating plate. A thermal resistance layer 1716 may be arranged between the heating plate 1714 and the baseplate 1712. The baseplate 1712 may include one or more channels 1718 for flowing coolant through the baseplate 1712.

If plasma is used, an RF generating system 1720 generates and outputs an RF voltage to one of the upper electrode 1704 and the lower electrode (e.g., the baseplate 1712 of the ESC 1706). The other one of the upper electrode 1704 and the baseplate 1712 may be DC grounded, AC grounded, or floating. For example, the RF generating system 1720 may include an RF generator 1722 that generates RF power that is fed by a matching and distribution network 1724 to the upper electrode 1704 or the baseplate 1712. In other examples, the plasma may be generated inductively or remotely.

A gas delivery system 1730 includes one or more gas sources 1732-1, 1732-2, . . . , and 1732-N (collectively gas sources 1732), where N is an integer greater than zero. The gas sources 1732 are connected by valves 1734-1, 1734-2, . . . , and 1734-N (collectively valves 1734) and mass flow controllers 1736-1, 1736-2, . . . , and 1736-N (collectively mass flow controllers 1736) to a manifold 1740. A vapor delivery system 1742 supplies vaporized precursor to the manifold 1740 or another manifold (not shown) that is connected to the processing chamber 1702. An output of the manifold 1740 is fed to the processing chamber 1702.

A temperature controller 1750 may be connected to a plurality of thermal control elements (TCEs) 1752 arranged in the heating plate 1714. The temperature controller 1750 may be used to control the plurality of TCEs 1752 to control a temperature of the ESC 1706 and the substrate 1708. The temperature controller 1750 may communicate with a coolant assembly 1754 to control coolant flow through the channels 1718. For example, the coolant assembly 1754 may include a coolant pump, a reservoir, and one or more temperature sensors (not shown). The temperature controller 1750 operates the coolant assembly 1754 to selectively flow the coolant through the channels 1718 to cool the ESC 1706. A valve 1756 and pump 1758 may be used to evacuate reactants from the processing chamber 1702. A system controller 1760 controls the components of the system 1700.

FIG. 7B shows another example of a substrate processing system 1800. The substrate processing system 1800 includes a coil driving circuit 1811. In some examples, the coil driving circuit 1811 includes an RF source 1812, a pulsing circuit 1814, and a tuning circuit (i.e., matching circuit) 1813. The pulsing circuit 1814 controls a transformer coupled plasma (TCP) envelope of an RF signal generated by the RF source 1812 and varies a duty cycle of TCP envelope between 1% and 99% during operation. As can be appreciated, the pulsing circuit 1814 and the RF source 1812 can be combined or separate.

The tuning circuit 1813 may be directly connected to an inductive coil 1816. While the substrate processing system 1810 uses a single coil, some substrate processing systems may use a plurality of coils (e.g., inner and outer coils). The tuning circuit 1813 tunes an output of the RF source 1812 to a desired frequency and/or a desired phase, and matches an impedance of the coil 1816.

A dielectric window 1824 is arranged along a top side of a processing chamber 1828. The processing chamber 1828 comprises a substrate support (or pedestal) 1832 to support a substrate 1834. The substrate support 1832 may include an electrostatic chuck (ESC), or a mechanical chuck or other type of chuck. Process gas is supplied to the processing chamber 1828 and plasma 1840 is generated inside of the processing chamber 1828. The plasma 1840 etches an exposed surface of the substrate 1834. An RF source 1850, a pulsing circuit 1851, and a bias matching circuit 1852 may be used to bias the substrate support 1832 during operation to control ion energy.

A gas delivery system 1856 may be used to supply a process gas mixture to the processing chamber 1828. The gas delivery system 1856 may include process and inert gas sources 1857, a gas metering system 1858 such as valves and mass flow controllers, and a manifold 1859. A gas injector 1863 may be arranged at a center of the dielectric window 1824 and is used to inject gas mixtures from the gas delivery system 1856 into the processing chamber 1828. Additionally or alternatively, the gas mixtures may be injected from the side of the processing chamber 1828.

A heater/cooler 1864 may be used to heat/cool the substrate support 1832 to a predetermined temperature. An exhaust system 1865 includes a valve 1866 and pump 1867 to control pressure in the processing chamber and/or to remove reactants from the processing chamber 1828 by purging or evacuation.

A controller 1854 may be used to control the etching process. The controller 1854 monitors system parameters and controls delivery of the gas mixture; striking, maintaining, and extinguishing the plasma; removal of reactants; supply of cooling gas; and so on. Additionally, as described below, the controller 1854 may control various aspects of the coil driving circuit 1810, the RF source 1850, and the bias matching circuit 1852, and so on.

FIG. 7C shows a processing chamber 1900 for etching a layer of a substrate. The processing chamber 1900 includes a lower chamber region 1902 and an upper chamber region 1904. The lower chamber region 1902 is defined by chamber sidewall surfaces 1908, a chamber bottom surface 1910, and a lower surface of a gas distribution device 1914.

The upper chamber region 1904 is defined by an upper surface of the gas distribution device 1914 and an inner surface of a dome 1918. In some examples, the dome 1918 rests on a first annular support 1921. In some examples, the first annular support 1921 includes one or more spaced holes 1923 for delivering process gas to the upper chamber region 1904. In some examples, the process gas is delivered by the one or more spaced holes 1923 in an upward direction at an acute angle relative to a plane including the gas distribution device 1914, although other angles/directions may be used. In some examples, a gas flow channel 1934 in the first annular support 1921 supplies gas to the one or more spaced holes 1923.

The first annular support 1921 may rest on a second annular support 1925 that defines one or more spaced holes 1927 for delivering process gas from a gas flow channel 1929 to the lower chamber region 1902. In some examples, holes 1931 in the gas distribution device 1914 align with the holes 1927. In other examples, the gas distribution device 1914 has a smaller diameter, and the holes 1931 are not needed. In some examples, the process gas is delivered by the one or more spaced holes 1927 in a downward direction towards a substrate 1926 at an acute angle relative to the plane including the gas distribution device 1914, although other angles/directions may be used. In other examples, the upper chamber region 1904 is cylindrical with a flat top surface and one or more flat inductive coils may be used. In still other examples, a single chamber may be used with a spacer located between a showerhead and the substrate support.

A substrate support 1922 is arranged in the lower chamber region 1904. In some examples, the substrate support 1922 includes an electrostatic chuck (ESC), although other types of substrate supports can be used. The substrate 1926 is arranged on an upper surface of the substrate support 1922 during etching. In some examples, a temperature of the substrate 1926 may be controlled by a heater plate 1930, an optional cooling plate with fluid channels, and one or more sensors (not shown), although any other suitable substrate support temperature control system may be used.

In some examples, the gas distribution device 1914 includes a showerhead (for example, a plate 1928 having a plurality of spaced holes 1927). The plurality of spaced holes 1927 extend from the upper surface of the plate 1928 to the lower surface of the plate 1928. In some examples, the spaced holes 1927 have a diameter in a range from 0.4" to 0.75" and the showerhead is made of a conducting material such as aluminum or a non-conductive material such as ceramic with an embedded electrode made of a conducting material.

One or more inductive coils 1940 are arranged around an outer portion of the dome 1918. When energized, the one or more inductive coils 1940 create an electromagnetic field inside of the dome 1918. In some examples, an upper coil and a lower coil are used. A gas injector 1942 injects one or more gas mixtures from a gas delivery system 1950-1.

In some examples, the gas delivery system 1950-1 includes one or more gas sources 1952, one or more valves 1954, one or more mass flow controllers (MFCs) 1956, and a mixing manifold 158, although other types of gas delivery systems may be used. A gas splitter (not shown) may be used to vary flow rates of a gas mixture. Another gas delivery system 1950-2 may be used to supply an etch gas or an etch gas mixture to the gas flow channels 1929 and/or 1934 (in addition to or instead of etch gas from the gas injector 1942).

In some examples, the gas injector 1942 includes a center injection location that directs gas in a downward direction and one or more side injection locations that inject gas at an angle with respect to the downward direction. In some examples, the gas delivery system 1950-1 delivers a first portion of the gas mixture at a first flow rate to the center injection location and a second portion of the gas mixture at a second flow rate to the side injection location(s) of the gas injector 1942. In other examples, different gas mixtures are delivered by the gas injector 1942. In some examples, the gas delivery system 1950-1 delivers tuning gas to the gas flow channels 1929 and 1934 and/or to other locations in the processing chamber as will be described below.

A plasma generator 1970 may be used to generate RF power that is output to the one or more inductive coils 1940. Plasma 1990 is generated in the upper chamber region 1904. In some examples, the plasma generator 1970 includes an RF generator 1972 and a matching network 1974. The matching network 1974 matches an impedance of the RF generator 1972 to the impedance of the one or more inductive coils 1940. In some examples, the gas distribution device 1914 is connected to a reference potential such as ground. A valve 1978 and a pump 1980 may be used to control pressure inside of the lower and upper chamber regions 1902, 1904 and to evacuate reactants.

A controller 1976 communicates with the gas delivery systems 1950-1 and 1950-2, the valve 1978, the pump 1980, and the plasma generator 1970 to control flow of process gas, purge gas, RF plasma and chamber pressure. In some examples, plasma is sustained inside the dome 1918 by the one or more inductive coils 1940. One or more gas mixtures are introduced from a top portion of the chamber using the gas injector 1942 (and/or holes 1923), and plasma is confined within the dome 1918 using the gas distribution device 1914.

Confining the plasma in the dome 1918 allows volume recombination of plasma species and effusing desired etchant species through the gas distribution device 1914. In some examples, there is no RF bias applied to the substrate 1926. As a result, there is no active sheath on the substrate 1926 and ions are not hitting the substrate with any finite energy. Some amount of ions will diffuse out of the plasma region through the gas distribution device 1914. However, the amount of plasma that diffuses is an order of magnitude lower than the plasma located inside the dome 1918. Most ions in the plasma are lost by volume recombination at high pressures. Surface recombination loss at the upper surface of the gas distribution device 1914 also lowers ion density below the gas distribution device 1914.

In other examples, an RF bias generator 1984 is provided and includes an RF generator 1986 and a matching network 1988. The RF bias can be used to create plasma between the gas distribution device 1914 and the substrate support or to create a self-bias on the substrate 1926 to attract ions. The controller 1976 may be used to control the RF bias.

The auto-configuration system can be used to auto-configure various components and assemblies of these process modules. Additionally, there are numerous other hardware components such as edge coupling rings, carrier rings, lift pin assemblies and associated rings, clamping and de-clamping electrodes, matrix heaters, and so on that can be used in these process modules, which are not shown and described for brevity. Further, the tools can include various other systems such as in-situ cleaning systems (e.g., to clean robot arms), which are also not shown and described for brevity. These components and systems can have different designs, which can make each hardware component different from other components. Accordingly, it can be helpful to correctly identify and configure these components and systems using the auto-configuration system and method described below.

Autoconfiguration System and Method

Figure 8:
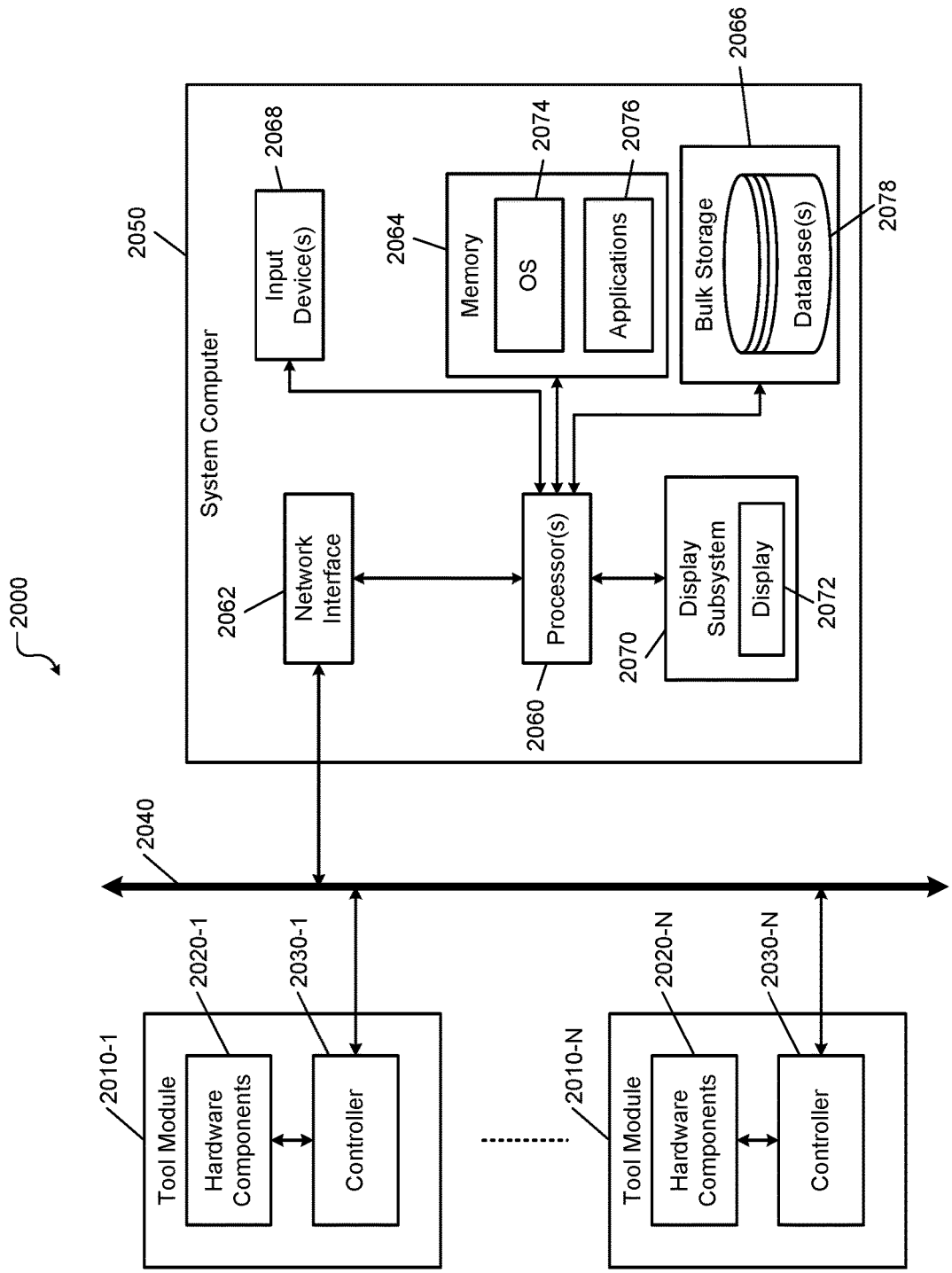
FIG. 8 shows a block diagram of a system for auto-configuring hardware components of a module of a substrate processing tool according to the present disclosure.

FIG. 8 shows an example of a system 2000 for auto-configuring hardware components of a module of a substrate processing tool according to the present disclosure. The system 2000 comprises a plurality of tool modules 2010-1, . . . , and 2010-N (collectively tool modules 2010), where N is an integer greater than 1. For example, the tool modules 2010 can include any of the load locks, EFEM, VTM, airlocks, and so on, which are described above with reference to FIGS. 1-6C. Further, the tool modules 2010 can include any of the process modules (PMs) described above with reference to FIGS. 7A-7C. The tool modules 2010 can further include any of the various assemblies, subassemblies, and modules of the tools described above with reference to FIGS. 1-6C.

Each of the tool modules 2010 comprises a plurality of hardware components 2020 (shown as elements 2020-1, . . . , and 2020-N), which are described above with reference to FIGS. 1-7C. For example, the components 2020 (e.g., valves, sensors, O-rings, electrodes, manifolds, a robot arm, etc.) in a tool module 2010 may depend on the type of the tool module 2010 (e.g., whether the tool module 2010 is a load lock, an EFEM, a VTM, an airlock, or a PM). In some examples, a tool module 2010 may include a single component 2020 (i.e., the single component is a tool module by itself).

Each of the tool modules 2010 comprises a controller 2030 (shown as elements 2030-1, . . . , and 2030-N). The controller 2030 may control the operation of the tool module 2010 by controlling the operations of the components 2020 of the tool module 2010. For example, the controller 2030 may communicate with a system computer 2050 via a system bus or a communication network 2040 of the tool. The system computer 2050 may provide instructions and data to the controller 2030 for operating the tool module 2010. The controller 2030 may operate the components 2020 based on the instructions and data received from the system computer 2050.

The controller 2030 stores a file that includes data or information about the hardware components 2020. For example, the file may include data such as but not limited to part number, serial number, date of manufacture, part location, and so on of each hardware component 2020 in the tool module 2010. For example, the file may store the data in a specific (e.g., JavaScript Object Notation or JSON) format. For example, the file may be transferred to the controller 2030 by the supplier of the tool module 2010 from a laptop computer (not shown) using a suitable connection (e.g., an Ethernet cable) between the laptop computer and the controller 2030. The controller 2030 provides the file to the system computer 2050 when the tool is powered on as explained below.

The controller 2030 may also provide data received from the components 2020 (e.g., sensors) to the system computer 2050. In addition, the controller 2030 may provide data indicating the status (e.g., wear and tear) of the components 2020 to the system computer 2050. Accordingly, the controller 2030 not only serves as the main controller of the tool module 2010 but also serves as the PCB where the file including the data or information about the hardware components 2020 is stored. Alternatively, the file can be stored anywhere on the tool module 2010 (e.g., in memory onboard the controller 2030 or some other component of the tool module 2010 that is capable of storing the file and that is integrated with (i.e., inseparable from and travels with) the tool module 2010).

In a simplified example shown, the system computer 2050 includes one or more CPUs/GPUs or processors 2060, a network interface 2062, memory 2064, and bulk storage 2066. In some implementations, the system computer 2050 may be a general-purpose server and may include one or more input devices 2068 (e.g., a keypad, touchpad, mouse, etc.) and a display subsystem 2070 including a display 2072.

The network interface 2062 connects the system computer 2050 to the communication network 2040 of the tool. For example, the network interface 2062 may include a wired interface (e.g., an Ethernet or EtherCAT interface) and/or a wireless interface (e.g., a Wi-Fi, Bluetooth, near field communication (NFC), or other wireless interface). The memory 2064 may include volatile or nonvolatile memory, cache, or other type of memory. The bulk storage 2066 may include flash memory, one or more magnetic hard disk drives (HDDs), or other bulk storage devices.

The processor 2060 of the system computer 2050 executes one or more operating system (OS) 2074 and one or more applications 2076, which may be housed in a virtual machine hypervisor or containerized architecture with shared memory. The bulk storage 2066 may store one or more databases 2078 that store data structures used by the applications 2076 to perform respective functions. The applications 2076 include a main tool software that operates the tool and a configuration application that controls the tool and that can automatically configure the tool modules 2010 according to the present disclosure as follows.

When the tool is powered on, the system computer 2050 executes a configuration application (e.g., an application 2076) that performs the following operations for each tool module 2010. The configuration application 2076 accesses the tool module 2010 via the system bus or the communication network 2040 of the tool. The configuration application 2076 receives the file including the data about the hardware components 2020 (described above) from the controller 2030 (or other component) of the tool module 2010 via the communication network 2040 of the tool. The configuration application 2076 reads the data in the file and learns about the components 2020 installed in the tool module 2010. The configuration application 2076 maps the components 2020 of the tool module 2010 that are identified by the file acquired from the tool module 2010 to corresponding configuration options (choices) in the configuration application 2076. The configuration application 2076 uses the configuration options to automatically configure the correctly identified components 2020 of the tool module 2010. The configuration application 2076 populates its drop down menus with only the correct configuration options that can be used to configure the correctly identified components 2020 of the tool module 2010.

After the auto-configuration of the components 2020 of the tool module 2010, an additional software selection may also be made to further configure a component 2020 of the tool module 2010. The user or operator of the tool can use the drop down menu in the configuration application 2076 to make the selection.

Further, the configuration application 2076 provides the user the option to override any auto-configuration choices, including selecting an option that conflicts with the physical hardware. Furthermore, when the user views the drop down menus, the configuration application 2076 can indicate to the user which of the options are defaults and which were selected by auto-configuration. When another user opens the configuration application 2076 later—after maintenance, for example—the later user also needs to know which options were selected by a previous user. The configuration application 2076 can implement a scheme including a marker or an indicator such as color, italic, comment, etc. indicating how the option in the drop down menu was selected: default, auto-configured, or user-selected. The marker may be implemented regardless of whether the user can or cannot override auto-configuration choices.

Additionally, the configuration application 2076 can display the component information on a user interface (UI) shown on the display 2072. This can be helpful in many ways. For example, a service person can quickly order the correct component based on the displayed component information without having to open the tool module 2010 and identifying the component 2020.

The main tool software can store usage and history data for each component 2020 of the tool module 2010 (e.g., in the bulk storage 2066). For example, this data can include but is not limited to a lifetime counter, indicating the age of the component 2020, and service/replacement history for the component 2020. This can be helpful in many ways. For example, if two identical components 2020 are used in the same manner in two tool modules 2010, the performance of the components 2020 can be compared based on this data. The performance comparison can help the supplier to improve the quality of the component 2020 if necessary. The main tool software can also analyze the data and generate an alert regarding need for service or replacement of the component 2020. Based on the alert, the user of the tool can proactively schedule service or order replacement for the component 2020 before the component 2020 fails, which can reduce tool downtime. The tool manufacturer can also use this data to suggest any engineering changes to the component design if necessary.

Figure 9:
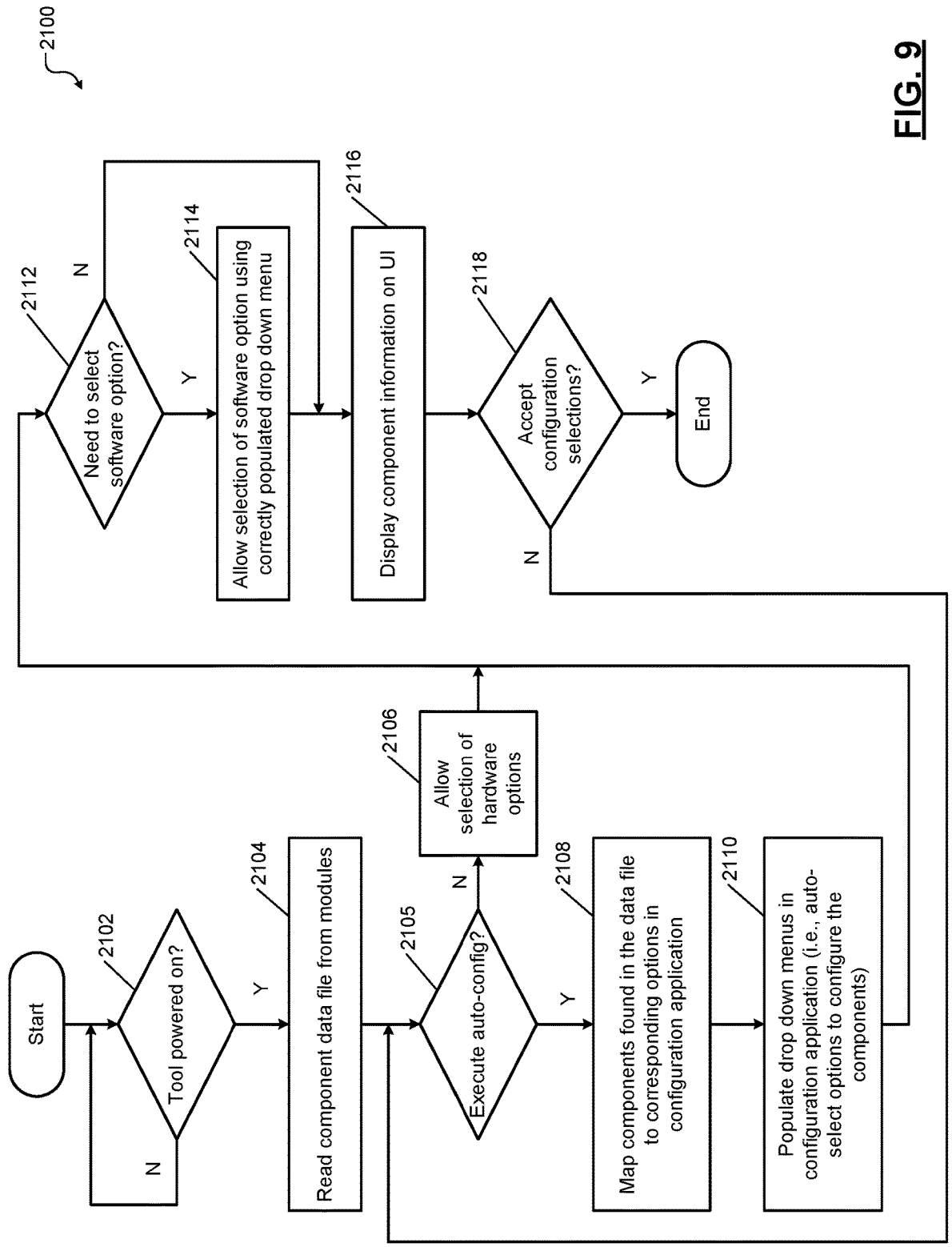
FIG. 9 shows a flowchart of a method for auto-configuring hardware components of a module of a substrate processing tool according to the present disclosure.

FIG. 9 shows a method 2100 for auto-configuring hardware components of a module of a substrate processing tool according to the present disclosure. For example, the system computer 2050 (e.g., the configuration application 2076) may perform the method 2100. For example, the processor 2060 and the memory 2064, collectively called a controller of the system computer 2050, may execute the configuration application 2076 and perform the method 2100.

At 2102, the method 2100 waits until the tool is powered on. At 2104, after the tool is powered on, the method 2100 reads a file received from a tool module including data about components of the tool module. At 2105, the method 2100 determines whether to execute auto-configuration using the file. For example, the method 2100 provides a choice on a user interface (UI) on the system computer in the form of a button that can be user-selected to execute auto-configuration. If the user selects the button (i.e., if the option to perform auto-configuration using the file is selected), the method 2100 proceeds to 2108. If the user does not select the button (i.e., if the option to perform auto-configuration using the file is not selected), the method 2100 proceeds to 2106. At 2106, the method 2100 allows the user to manually select the hardware configuration using the drop down menus, and the method 2100 proceeds to 2112. In some implementations, steps 2105 and 2106 may be omitted, and the method 2100 may proceed from 2104 directly to 2108 (i.e., automatically execute the auto-configuration).

At 2108, the method 2100 maps the components identified in the file to corresponding configuration options (choices) in the configuration application. At 2110, the method 2100 populates the drop down menus in the configuration application based on the mapping so that only the correct configuration options are available for configuring the identified components. Thus, the method 2100 automatically selects the correct options for configuring the identified components and configures the identified components of the tool module (i.e., populating the drop down menus is the automatic selection).

At 2112, the method 2100 allows a user of the tool to determine if any of the auto-configured components of the tool module needs to be further configured using any software option. If a software configuration is not needed, the method 2100 proceeds to 2116. If a software configuration is needed, at 2114, the method 2100 allows the user to select a software configuration option from the drop down menu that is already correctly populated based on the mapping, for further configuring the component, and the method 2100 proceeds to 2116.

At 2116, the method 2100 displays the component information on the UI on the system computer. This way, the user can verify or confirm whether the configuration of the tool, whether configured using auto-configuration or otherwise, is correct. At 2118, the method 2100 determines if the tool configuration is confirmed by the user (e.g., by clicking on an OK button, for example, on the UI). The method 2100 ends if the tool configuration is confirmed by the user. The method 2100 returns to 2105 if the tool configuration is not confirmed by the user to allow reconfiguration using either auto-configuration or manual configuration as described above.

After the configuration process is completed as described above, the configuration application 2076 closes. The main tool software running on the system computer 2050 modifies a configuration file reflecting the configuration performed by the configuration application 2076 and reboots. When the main tool software is running, the user can open the configuration application 2076 to check the configuration options. The main tool software reboots after any configuration changes are made using configuration application 2076 (e.g., during installation of the tool, after adding a module to the tool during an upgrade, after replacing a module or after making hardware changes during or after maintenance, etc.).

As explained above with reference to FIG. 8, the main tool software, which can be one of the applications 2076 that can run on the system computer 2050 mutually exclusively with the configuration application, can store usage and history data (e.g., lifetime counter and service/replacement data) for the component. The main tool software can analyze the usage and history data and can generate alerts (e.g., proactive service/replacement of the component) based on the analyses.

The foregoing description is merely illustrative in nature and is not intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements.

As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process.

In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control.

Thus, as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A substrate processing system comprising:
   a module of the substrate processing system configured to perform an operation associated with processing a semiconductor substrate in the substrate processing system, the operation comprising a deposition or etching process, the module including:
      a component used with the processing of the semiconductor substrate; and
      a file stored in the module, the file including information about the component of the module, the information comprising at least one of a part number, a serial number, a manufacturing date, and a location of the component in the module; and a controller of the substrate processing system configured to:
communicate with the module via a network of the substrate processing system;
receive the file from the module via the network of the substrate processing system;
read the information about the component from the received file;
correlate the information about the component that is read from the received file to a corresponding option from a plurality of options in an application used to configure the module, the plurality of options configuring different components based on their respective information to perform the deposition or etching process;
automatically select the option from the plurality of options in the application, to which the information about the component of the module is correlated, to configure the component of the module;
automatically configure the component of the module using the automatically selected option; and
perform the operation associated with processing the semiconductor substrate in the substrate processing system using the automatically configured component of the module.

2. The substrate processing system of claim 1 wherein the controller is further configured to populate a drop-down menu of the application with the automatically selected option to which the component is correlated.

3. The substrate processing system of claim 2 wherein the controller is further configured to allow additional configuration of the component using the automatically selected option from the drop-down menu of the application.

4. The substrate processing system of claim 1 wherein the module includes a load lock, an airlock, an equipment front end module, a vacuum transfer module, or a process module of the substrate processing system.

5. The substrate processing system of claim 1 wherein the controller is further configured to:
store data about at least one of usage of the component and service performed on the component;
analyze the data; and
generate an alert indicating a status of the component.

6. The substrate processing system of claim 1 wherein the information is stored in the file in a JavaScript Object Notation format.

7. The substrate processing system of claim 1 wherein the application is further configured to display the information about the component after automatically configuring the component.

8. The substrate processing system of claim 1 wherein when the component is used in the same manner in two assemblies, the application is further configured to compare performance of the component in the two assemblies.

9. A substrate processing system comprising:
a processor; and
a memory storing an application for execution by the processor to:
receive, from a module of the substrate processing system, a file including information about a component of the module, the information comprising at least one of a part number, a serial number, a manufacturing date, and a location of the component in the module; wherein the module is configured to perform an operation associated with the processing of a semiconductor substrate in the substrate processing system; and wherein the component is used to perform the operation comprising a deposition or etching process on the semiconductor substrate;
correlate the information about the component that is read from the received file to a corresponding option from a plurality of options in the application used to configure the module, the plurality of options configuring different components based on their respective information to perform the deposition or etching process;
automatically select the option from the plurality of options in the application, to which the information about the component of the module is correlated, to configure the component of the module;
automatically configure the component of the module using the automatically selected option in the application; and
process a semiconductor substrate in the substrate processing system using the automatically configured component of the module.

10. The substrate processing system of claim 9 wherein the application is further configured to populate a drop-down menu of the application with the automatically selected option to which the component is correlated.

11. The substrate processing system of claim 10 wherein the application is further configured to allow additional configuration of the component using the automatically selected option from the drop-down menu of the application.

12. The substrate processing system of claim 9 wherein the module includes a load lock, an airlock, an equipment front end module, a vacuum transfer module, or a process module of the substrate processing system.

13. The substrate processing system of claim 9 wherein the application is further configured to:
store data in the memory about at least one of usage of the component and service performed on the component;
analyze the data; and
generate an alert indicating a status of the component.

14. The substrate processing system of claim 9 wherein the application is further configured to:
communicate with the module via a network of the substrate processing system; and
receive the file from the module via the network of the substrate processing system.

15. The substrate processing system of claim 9 wherein the information is stored in the file in a JavaScript Object Notation format.

16. The substrate processing system of claim 9 wherein the application is further configured to display the information about the component after automatically configuring the component.

17. The substrate processing system of claim 9 wherein when the component is used in the same manner in two assemblies, the application is further configured to compare performance of the component in the two assemblies.

* * * * *